United States Patent
Kang et al.

(10) Patent No.: US 9,520,458 B2
(45) Date of Patent: Dec. 13, 2016

(54) RESISTOR FORMED USING RESISTANCE PATTERNS AND SEMICONDUCTOR DEVICES INCLUDING THE SAME

(71) Applicant: Samsung Electronics Co., Ltd., Suwon-si, Gyeonggi-do (KR)

(72) Inventors: Myung Gil Kang, Seoul (KR); Dongwon Kim, Seongnam-si (KR); Ilryong Kim, Seongnam-si (KR); Changwoo Oh, Suwon-si (KR); Keun Hwi Cho, Seoul (KR); Toshinori Fukai, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/718,685

(22) Filed: May 21, 2015

(65) Prior Publication Data
US 2016/0087026 A1   Mar. 24, 2016

(30) Foreign Application Priority Data
Sep. 23, 2014   (KR) .................. 10-2014-0126733

(51) Int. Cl.
*H01L 27/11*   (2006.01)
*H01L 49/02*   (2006.01)
*H01L 27/06*   (2006.01)

(52) U.S. Cl.
CPC ........... *H01L 28/20* (2013.01); *H01L 27/0629* (2013.01)

(58) Field of Classification Search
CPC .................... H01L 23/5256; H01L 27/11206
See application file for complete search history.

(56) References Cited

U.S. PATENT DOCUMENTS

| 5,473,848 | A | 12/1995 | Kangas |
| 7,071,052 | B2 | 7/2006 | Yeo et al. |
| 7,919,816 | B2 | 4/2011 | Gossner et al. |
| 8,609,499 | B2 * | 12/2013 | Ho ................... H01L 29/66795 257/E21.619 |
| 9,349,837 | B2 * | 5/2016 | Ching .............. H01L 29/66795 |
| 2007/0128740 | A1 * | 6/2007 | Donze .................... H01L 22/34 438/14 |
| 2010/0052059 | A1 * | 3/2010 | Lee ..................... H01L 29/6659 257/368 |
| 2012/0175749 | A1 | 7/2012 | Haensch et al. |
| 2012/0261726 | A1 * | 10/2012 | Yang ................ H01L 21/28123 257/288 |
| 2013/0105895 | A1 * | 5/2013 | Liang ................ H01L 27/11206 257/347 |
| 2013/0105942 | A1 | 5/2013 | Chen et al. |

(Continued)

FOREIGN PATENT DOCUMENTS

| JP | 2011040768 A | 2/2011 |
| KR | 20120048903 A | 5/2012 |
| WO | WO 2012/094155 A1 | 7/2012 |

*Primary Examiner* — Mark Tornow
(74) *Attorney, Agent, or Firm* — Myers Bigel, P.A.

(57) ABSTRACT

Embodiments of the inventive concepts provide a resistor and a semiconductor device including the same. The resistor includes a substrate, a device isolation layer in the substrate which defines active regions arranged in a first direction a resistance layer including resistance patterns that vertically protrude from the active regions and are connected to each other in the first direction, and contact electrodes on the resistance layer.

20 Claims, 34 Drawing Sheets

(56) References Cited

U.S. PATENT DOCUMENTS

| | | | | |
|---|---|---|---|---|
| 2013/0119482 A1* | 5/2013 | Wann | ................ | H01L 29/66818 257/401 |
| 2013/0153960 A1* | 6/2013 | Yang | .................. | H01L 23/5252 257/183 |
| 2013/0270559 A1* | 10/2013 | Hafez | ............... | H01L 27/11206 257/50 |
| 2013/0307074 A1 | 11/2013 | Cheng et al. | | |
| 2013/0307076 A1 | 11/2013 | Cheng et al. | | |

\* cited by examiner

RESISTOR FORMED USING RESISTANCE PATTERNS AND SEMICONDUCTOR DEVICES INCLUDING THE SAME

CROSS-REFERENCE TO RELATED APPLICATION

This U.S. non-provisional patent application claims priority under 35 U.S.C. §119 to Korean Patent Application No. 10-2014-0126733, filed on Sep. 23, 2014, in the Korean Intellectual Property Office, the disclosure of which is incorporated by reference herein in its entirety.

BACKGROUND

The inventive concepts relate to a resistor and semiconductor devices including the same. More particularly, the inventive concepts relate to a resistor formed using a process of forming a fin field effect transistor and semiconductor devices including the same.

Semiconductor devices including a transistor, a capacitor, a diode, and/or a resistor may be widely used in electronic devices such as, for example, a digital camera, an MP3 player, a portable phone, or a computer. The resistor may have a simple structure but may be an important element for operating an electronic circuit. This resistor may have resistance values having various magnitudes according to a use of the semiconductor device. Generally, a length of the resistor may be increased to satisfy a desired resistance magnitude of the resistor.

SUMMARY

Embodiments of the inventive concepts may provide a resistor having a uniform resistance value and semiconductor devices including the same.

In one aspect, a resistor may include: a substrate; a device isolation layer in the substrate which defines active regions arranged in a first direction; a resistance layer including resistance patterns that vertically protrude from the active regions and are arranged in the first direction so as to be connected to each other; and contact electrodes on the resistance layer.

In some embodiments, a bottom surface of the resistance layer may include first convex portions and first depressed portions that are alternately and repeatedly arranged.

In some embodiments, a top surface of the resistance layer may include second convex portions and second depressed portions that are alternately and repeatedly arranged. The first convex portions may face the second depressed portions, respectively, and the first depressed portions may face the second convex portions, respectively.

In some embodiments, the first convex portions may be on the device isolation layer, and respective ones of the first depressed portions may be on respective ones of the active regions.

In some embodiments, the first convex portions may be spaced apart from the device isolation layer, and respective ones of the first depressed portions may be in contact with respective ones of the active regions.

In some embodiments, a sidewall of the resistance layer may have a protruding corner.

In some embodiments, the resistance layer may include an epitaxial layer grown from the active regions by an epitaxial growth method.

In another aspect, a semiconductor device may include: a substrate including a first region and a second region; a device isolation layer in the substrate which defines active regions, the active regions respectively including active fins vertically protruding from a top surface of the device isolation layer, and the active fins arranged in a first direction; conductive patterns intersecting the active fins; a resistance layer including resistance patterns that protrude from the active regions between the conductive patterns in the first region and are arranged in the first direction so as to be connected to each other, the resistance layer intersecting the active regions; and contact electrodes on the resistance layer.

In some embodiments, a length of the resistance layer in the first direction may be longer than a length of the conductive patterns in the first direction such that a first end of the resistance layer and a second end of the resistance layer, opposite to each other in the first direction, extend beyond the conductive patterns.

In some embodiments, the first end of the resistance layer and the second end of the resistance layer may be on the device isolation layer.

In some embodiments, the semiconductor device may also include source/drain regions protruding from the active regions between the conductive patterns in the second region. The source/drain regions may be spaced apart from each other in the first direction. The source/drain regions may include substantially the same material as the resistance layer.

In some embodiments, a distance between the conductive patterns may define a width of the resistance layer. The width of the resistance layer may be reduced as a number of the conductive patterns increases.

In some embodiments, a bottom surface of the resistance layer may include first convex portions and first depressed portions that are alternately and repeatedly arranged.

In some embodiments, the first convex portions may be on the device isolation layer, and the first depressed portions may be on the active regions.

In some embodiments, the contact electrodes may include a first contact electrode on a first end of the resistance layer and a second contact electrode on a second end of the resistance layer which are opposite to each other in the first direction. The first contact electrode may be in contact with a first resistance pattern and the second contact electrode may be in contact with a second resistance pattern.

In another aspect, a semiconductor device may include: a substrate; a device isolation layer in the substrate which defines a plurality of active regions arranged in a first direction and extending in a second direction substantially perpendicular to the first direction; a plurality of active fins on respective ones of the plurality of active regions, the plurality of active fins arranged in the first direction and extending in the second direction; and a plurality of resistance layers on the plurality of the active regions, the plurality of resistance layers arranged in the second direction and extending in the first direction. The plurality of resistance layers may further include a plurality of resistance patterns connected to one another and disposed on respective ones of the plurality of active regions. Respective ones of the plurality of resistance patterns may be formed in recessed portions of respective ones of the plurality of active fins.

In some embodiments, a bottom surface of respective ones of the plurality of resistance layers may include first convex portions and first depressed portions that are alternately and repeatedly arranged. A top surface of respective ones of the plurality of resistance layers may include second convex portions and second depressed portions that are alternately and repeatedly arranged. Respective ones of the first convex portions may face respective ones of the second depressed portions, and respective ones of the first depressed portions may face respective ones of the second convex portions.

In some embodiments, a location corresponding to where a respective first convex portion faces a respective second depressed portion may include a boundary between a first resistance pattern and a second resistance pattern.

In some embodiments, the semiconductor device may further include a plurality of conductive patterns on the plurality of the active regions, the plurality of conductive patterns arranged in the second direction and extending in the first direction. Respective ones of the plurality of resistance layers may be between respective ones of the conductive patterns. A width of a respective one of the plurality of resistance layers may correspond to a distance between adjacent first and second conductive patterns.

In some embodiments, a respective one of the resistance patterns may have a sidewall comprising at least two crystal planes.

BRIEF DESCRIPTION OF THE DRAWINGS

The inventive concepts will become more apparent in view of the attached drawings and accompanying detailed description.

FIGS. 4A to 12A are plan views illustrating a method of fabricating semiconductor devices including a resistor according to example embodiments of the inventive concepts;

FIGS. 4B to 12B are cross-sectional views taken along lines I-I' of FIGS. 4A to 12A, respectively, to illustrate a method of fabricating semiconductor devices including a resistor according to example embodiments of the inventive concepts;

FIGS. 4C to 12C are cross-sectional views taken along lines of FIGS. 4A to 12A, respectively, to illustrate a method of fabricating semiconductor devices including a resistor according to example embodiments of the inventive concepts;

FIGS. 4D to 12D are cross-sectional views taken along lines III-III' of FIGS. 4A to 12A, respectively, to illustrate a method of fabricating semiconductor devices including a resistor according to example embodiments of the inventive concepts;

FIGS. 4E to 12E are cross-sectional views taken along lines IV-IV' of FIGS. 4A to 12A, respectively, to illustrate a method of fabricating semiconductor devices including a resistor according to example embodiments of the inventive concepts;

DETAILED DESCRIPTION

Figure 1:
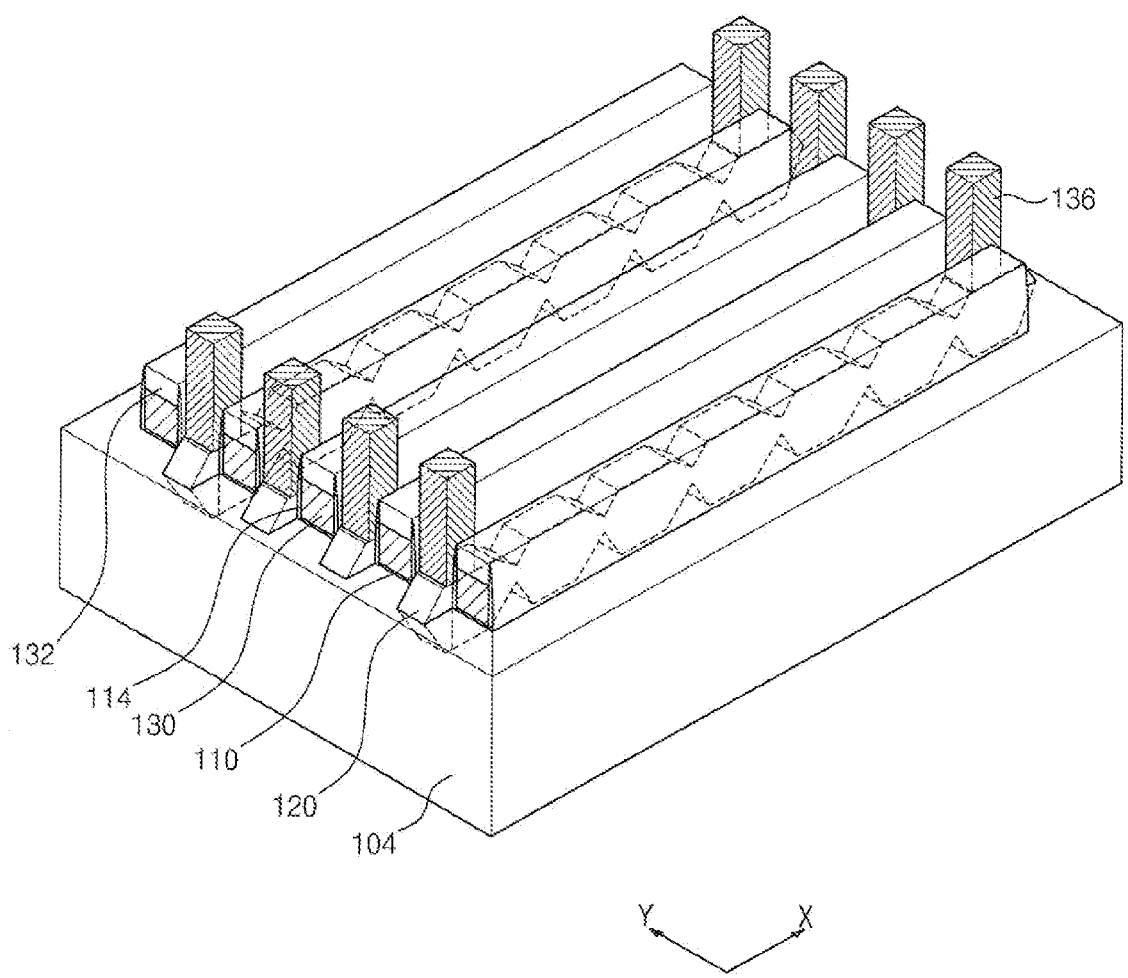
FIG. 1 is a perspective view illustrating a resistor according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal example views of the inventive concepts. Accordingly, shapes of the example views may be modified according to manufacturing technique, and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
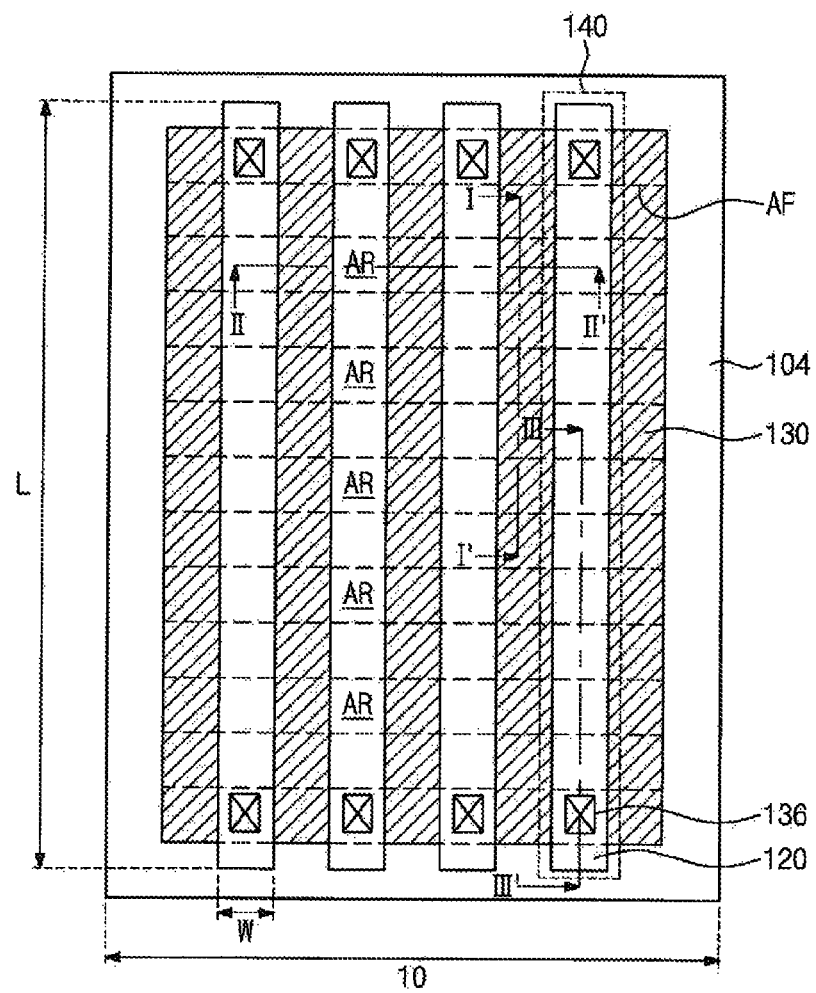
FIG. 2 is a plan view illustrating semiconductor devices including a resistor according to example embodiments of the inventive concepts.
Figure 2:
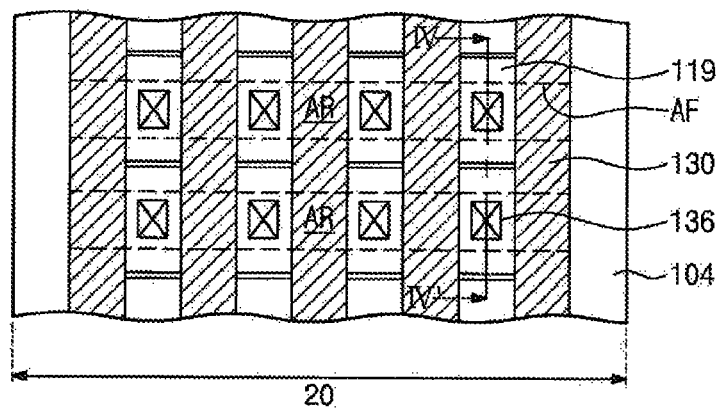
Figure 3A:
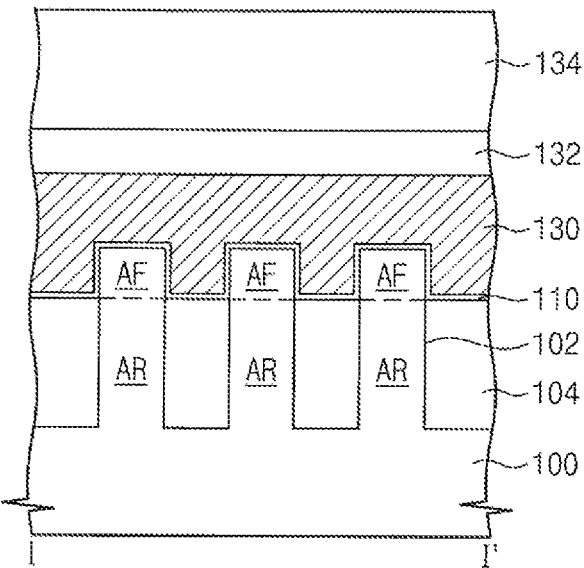
FIGS. 3A, 3B, 3C, and 3D are cross-sectional views taken along lines I-I, II-II', III-III', and IV-IV' of FIG. 2, respectively.
Figure 3B:
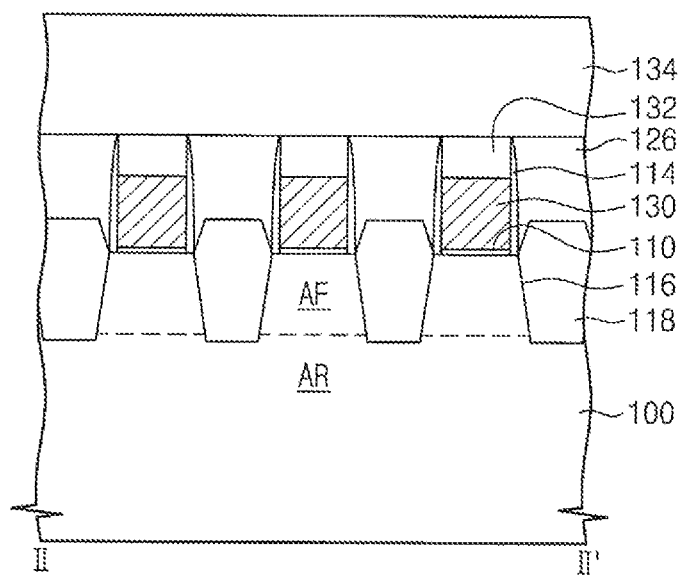
Figure 3C:
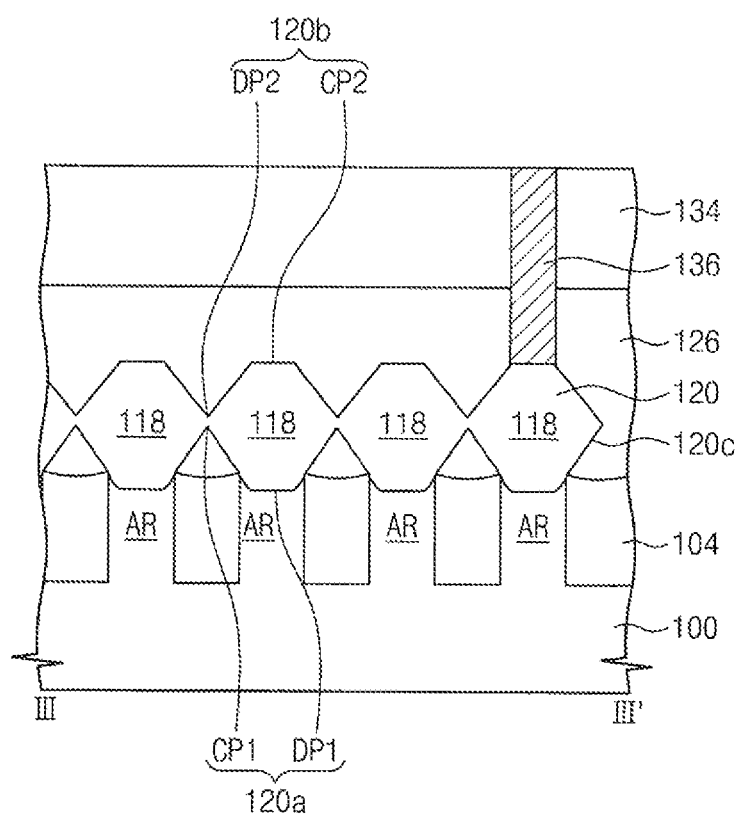
Figure 3D:
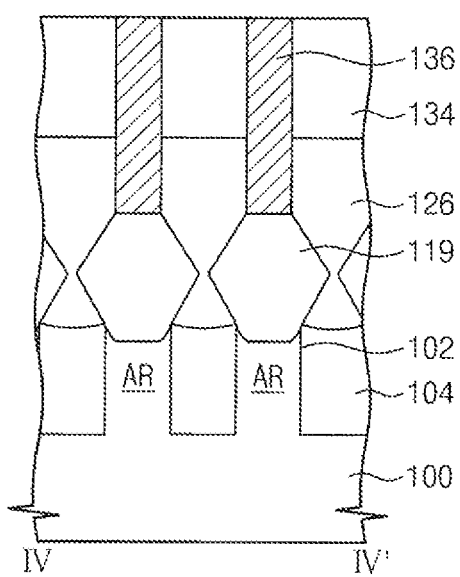
Figure 4A:
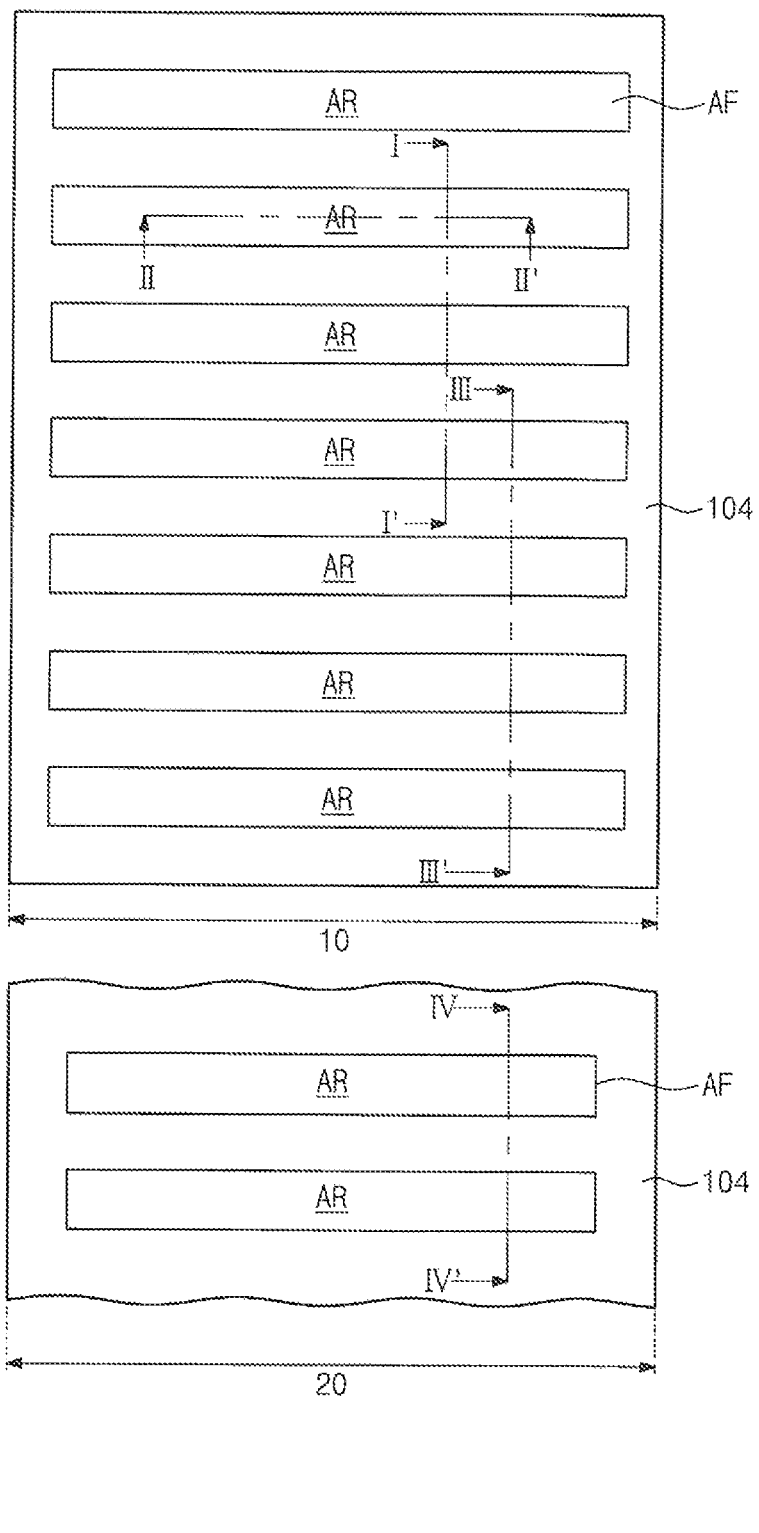
Figure 4B:
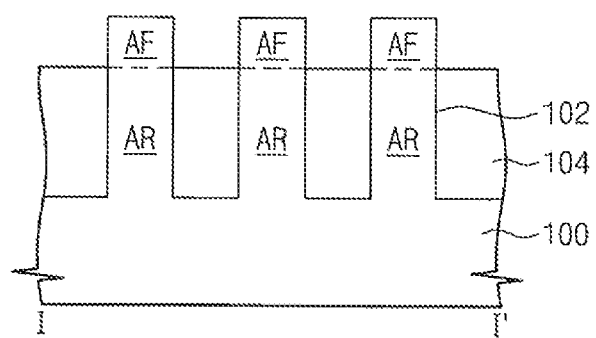
Figure 4C:
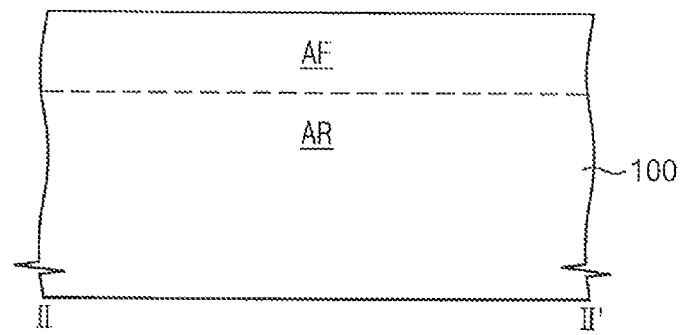
Figure 4D:
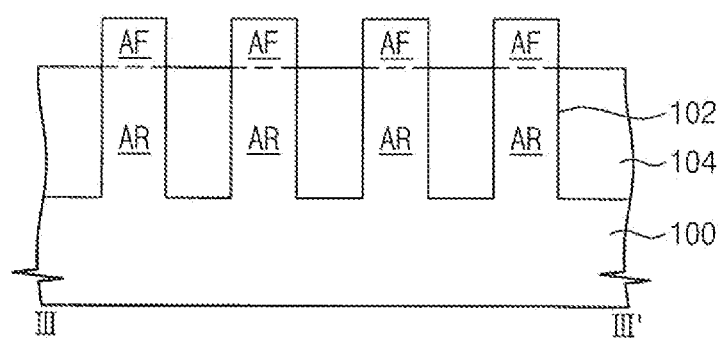
Figure 4E:
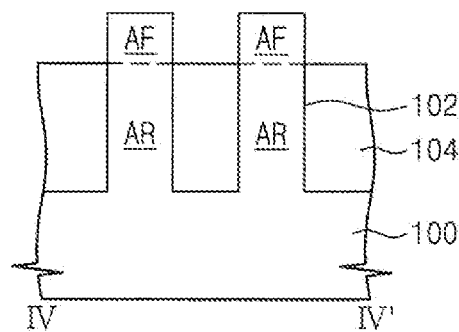
Figure 5A:
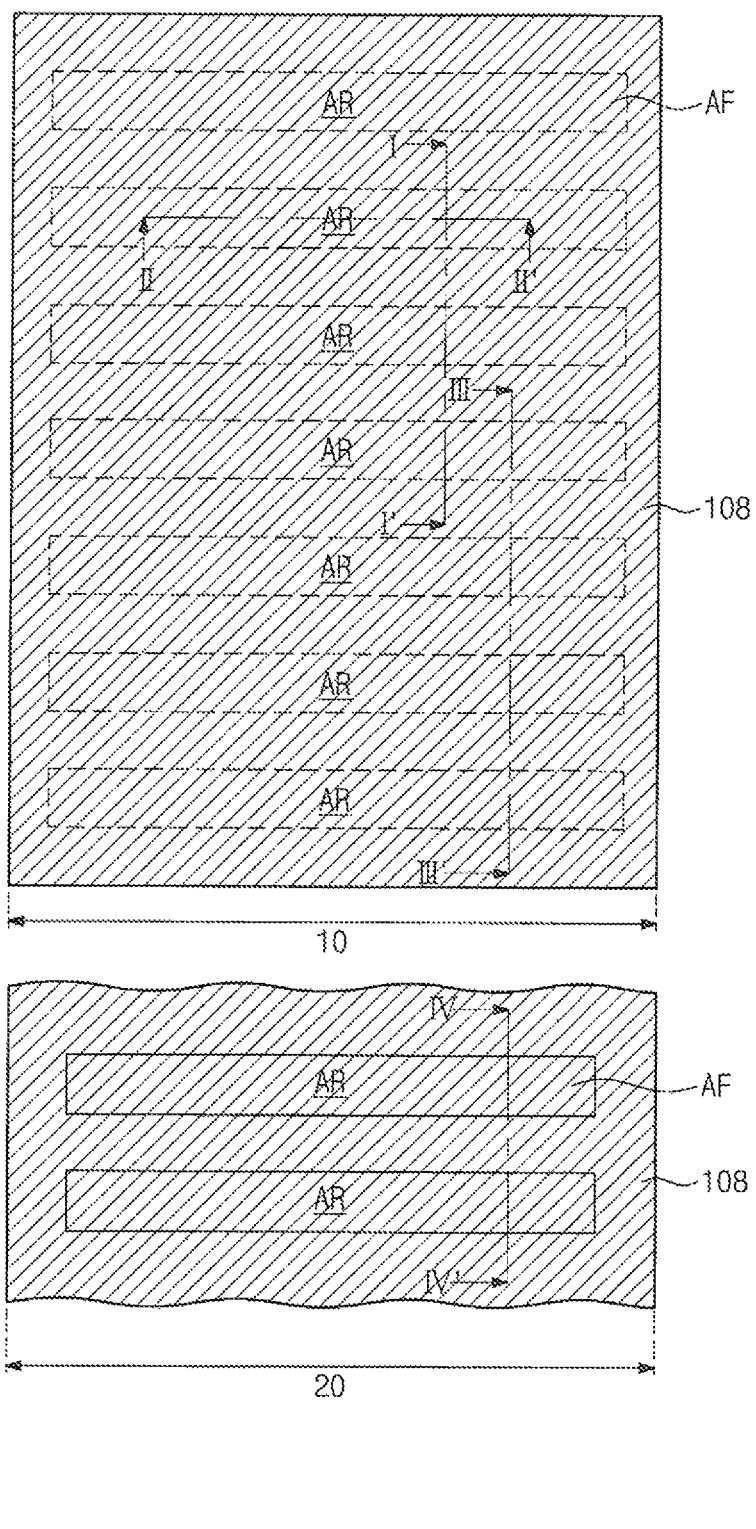
Figure 5B:
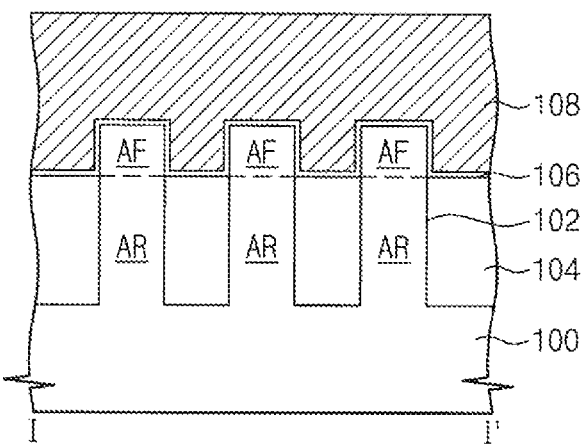
Figure 5C:
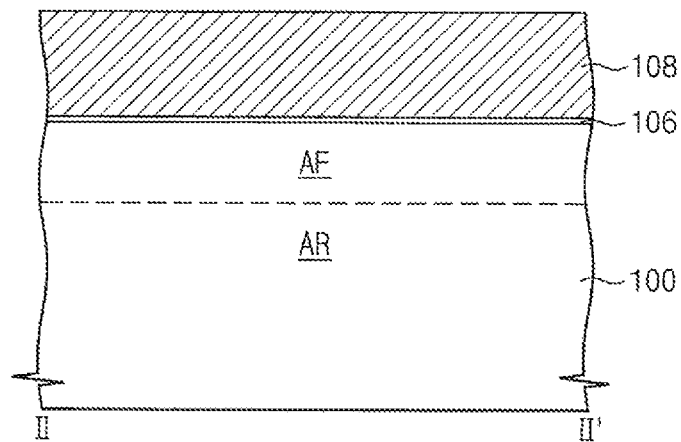
Figure 5D:
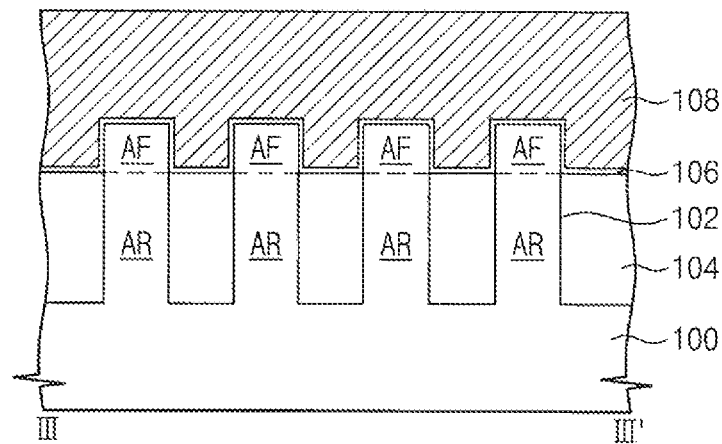
Figure 5E:
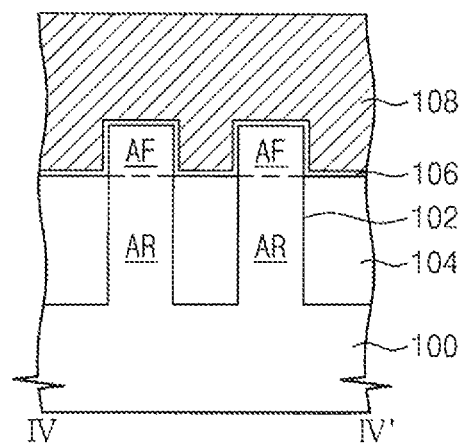
Figure 6A:
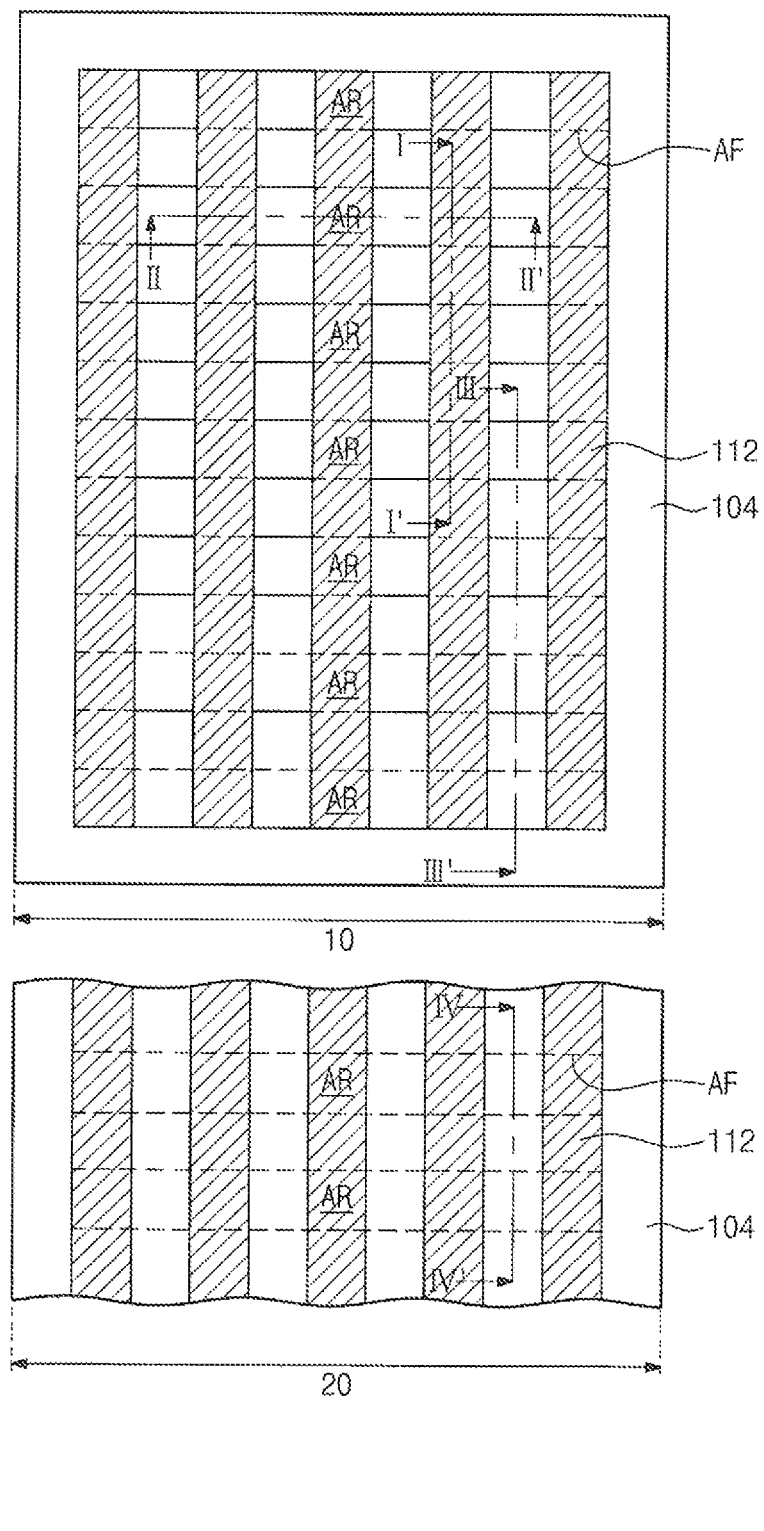
Figure 6B:
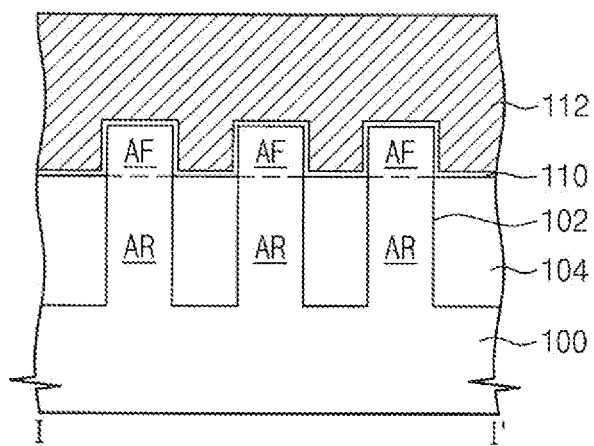
Figure 6C:
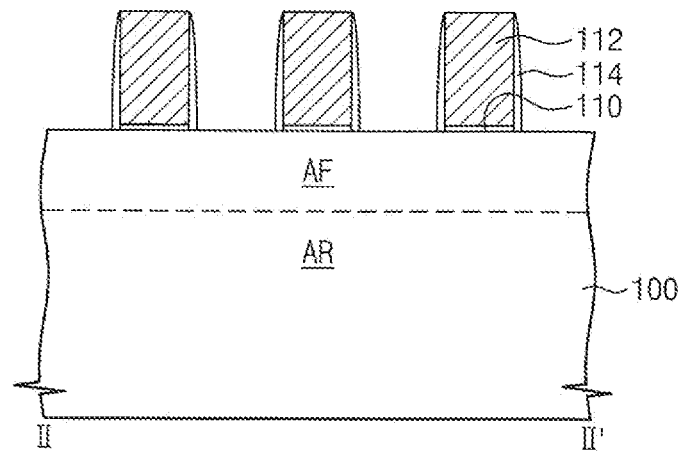
Figure 6D:
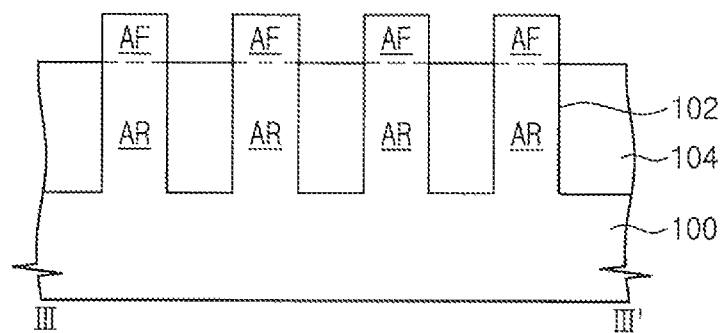
Figure 6E:
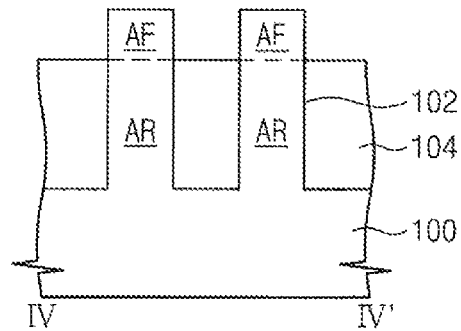
Figure 7A:
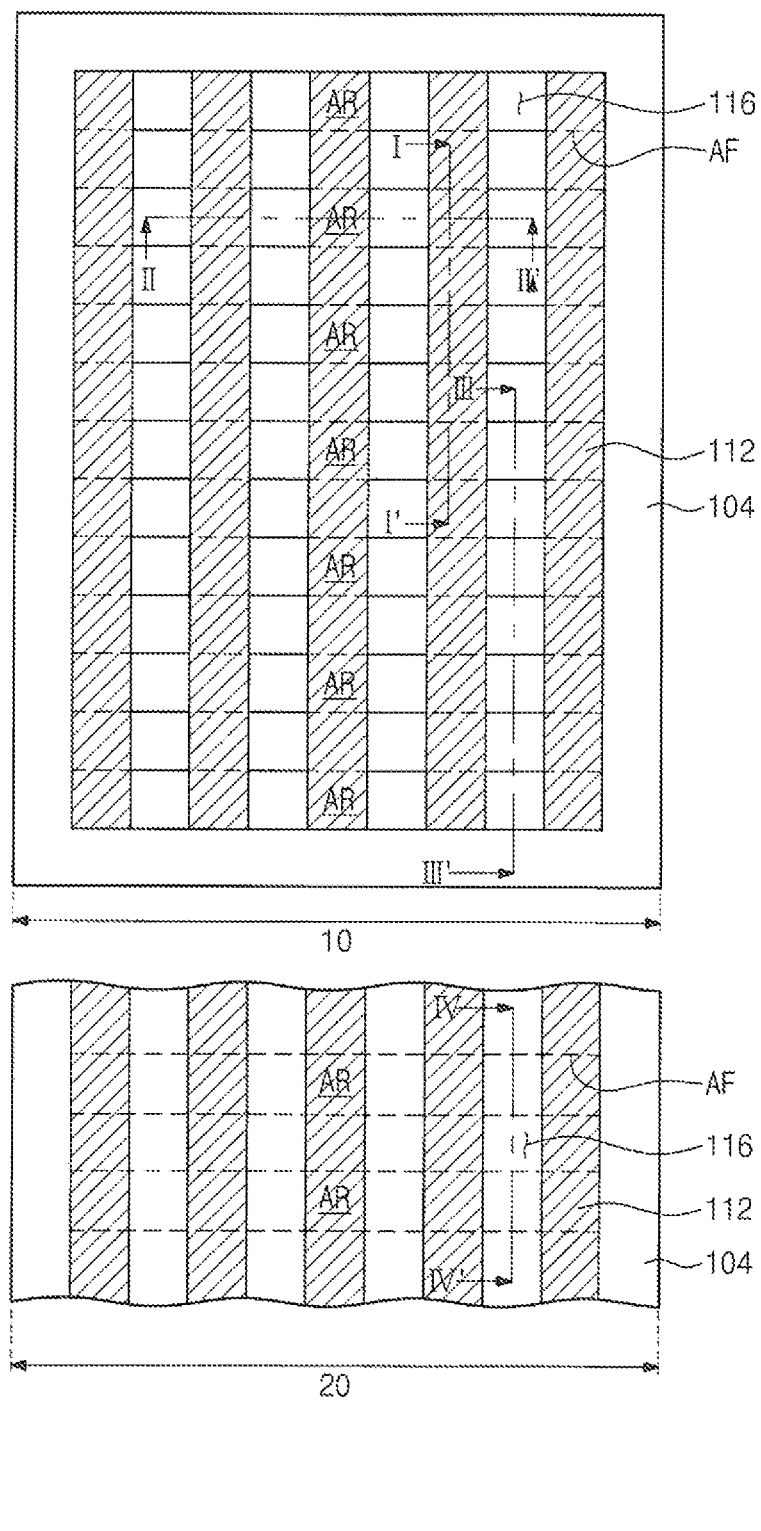
Figure 7B:
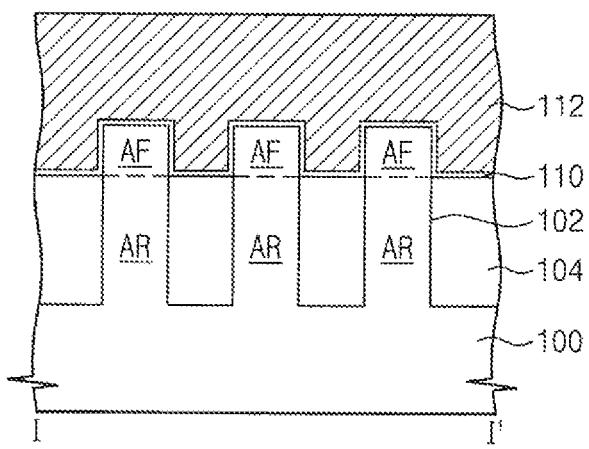
Figure 7C:
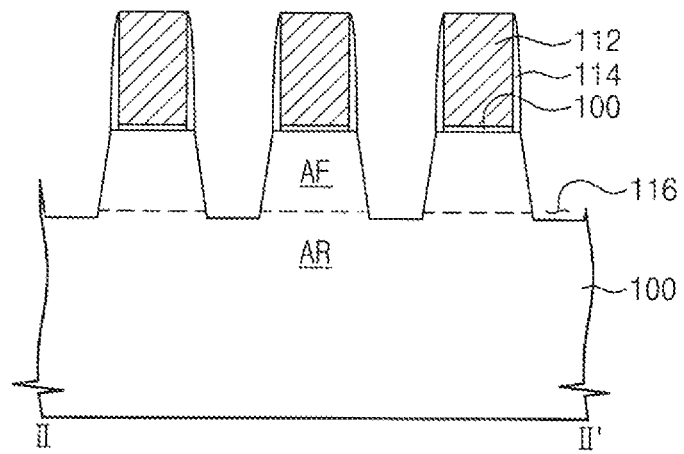
Figure 7D:
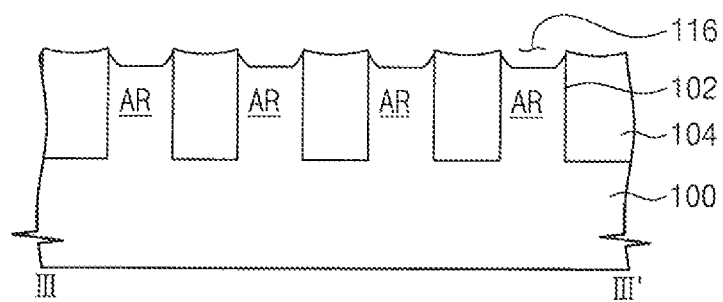
Figure 7E:
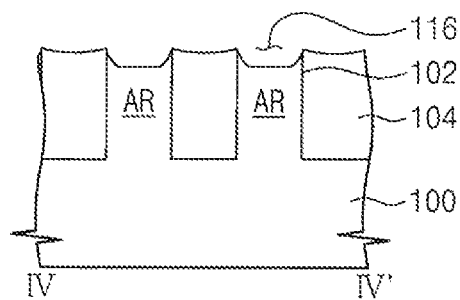
Figure 8A:
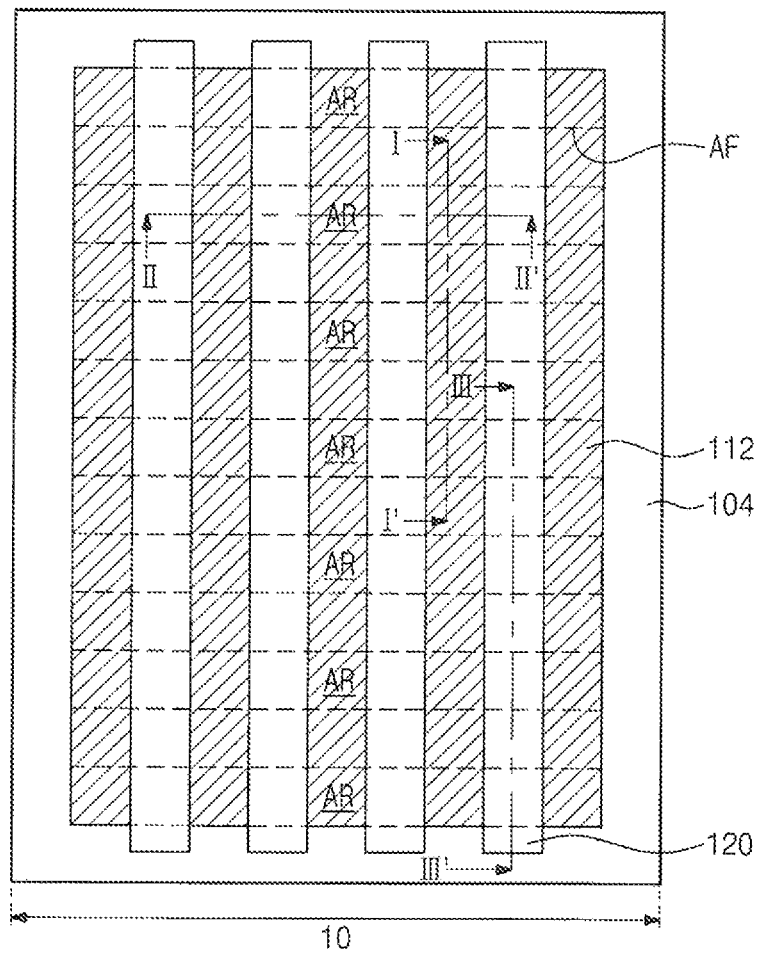
Figure 8A:
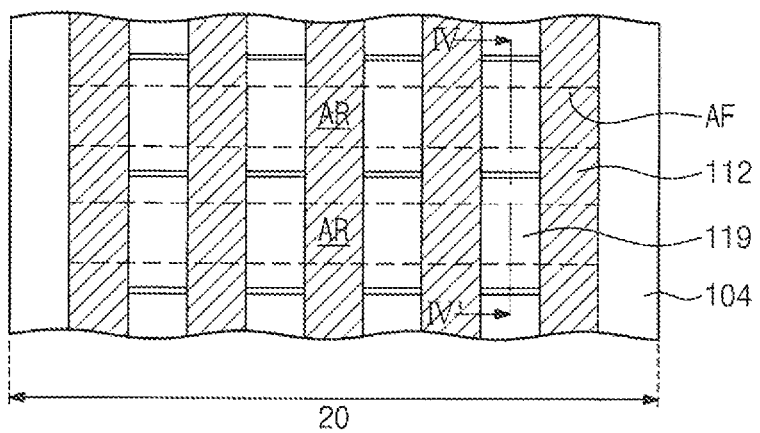
Figure 8A:
Figure 8B:
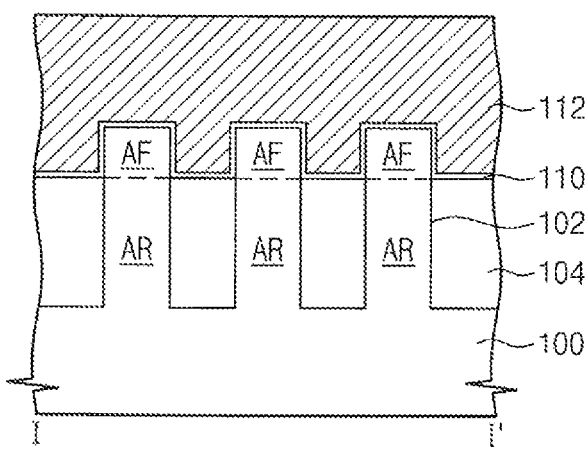
Figure 8C:
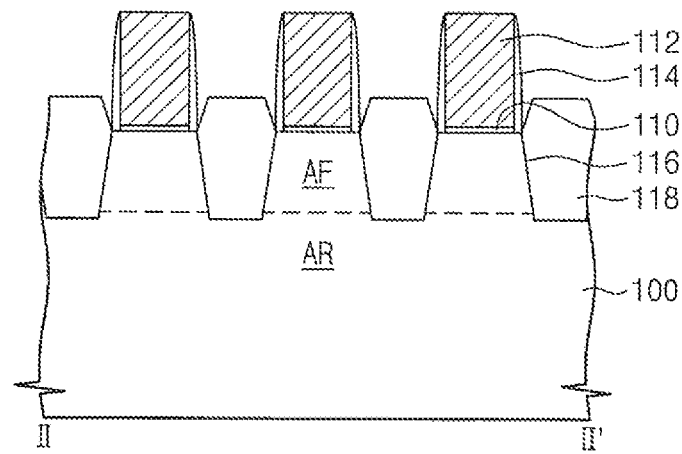
Figure 8D:
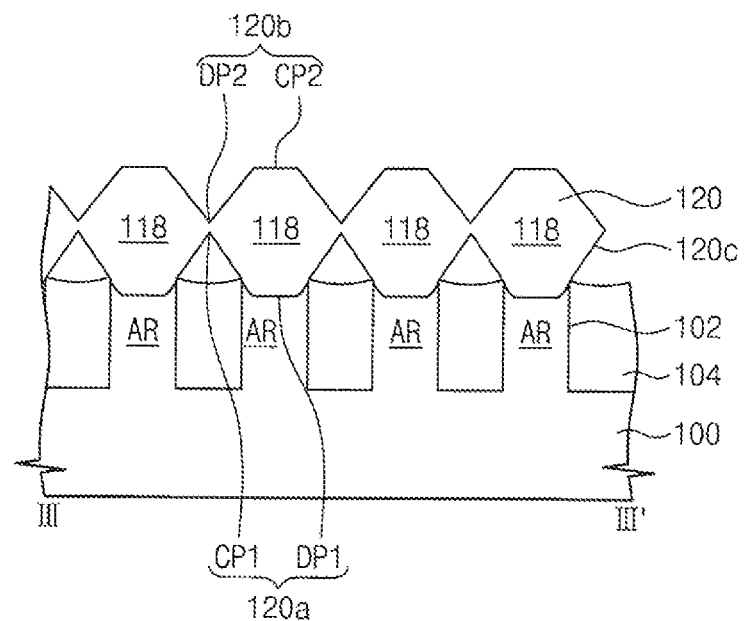
Figure 8E:
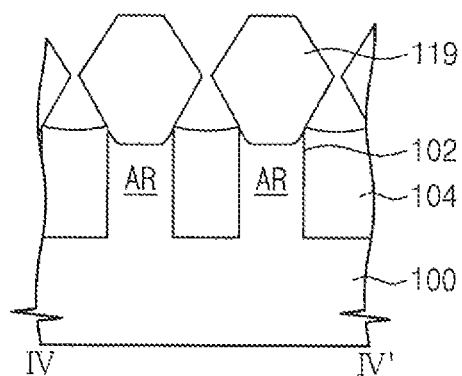
Figure 9A:
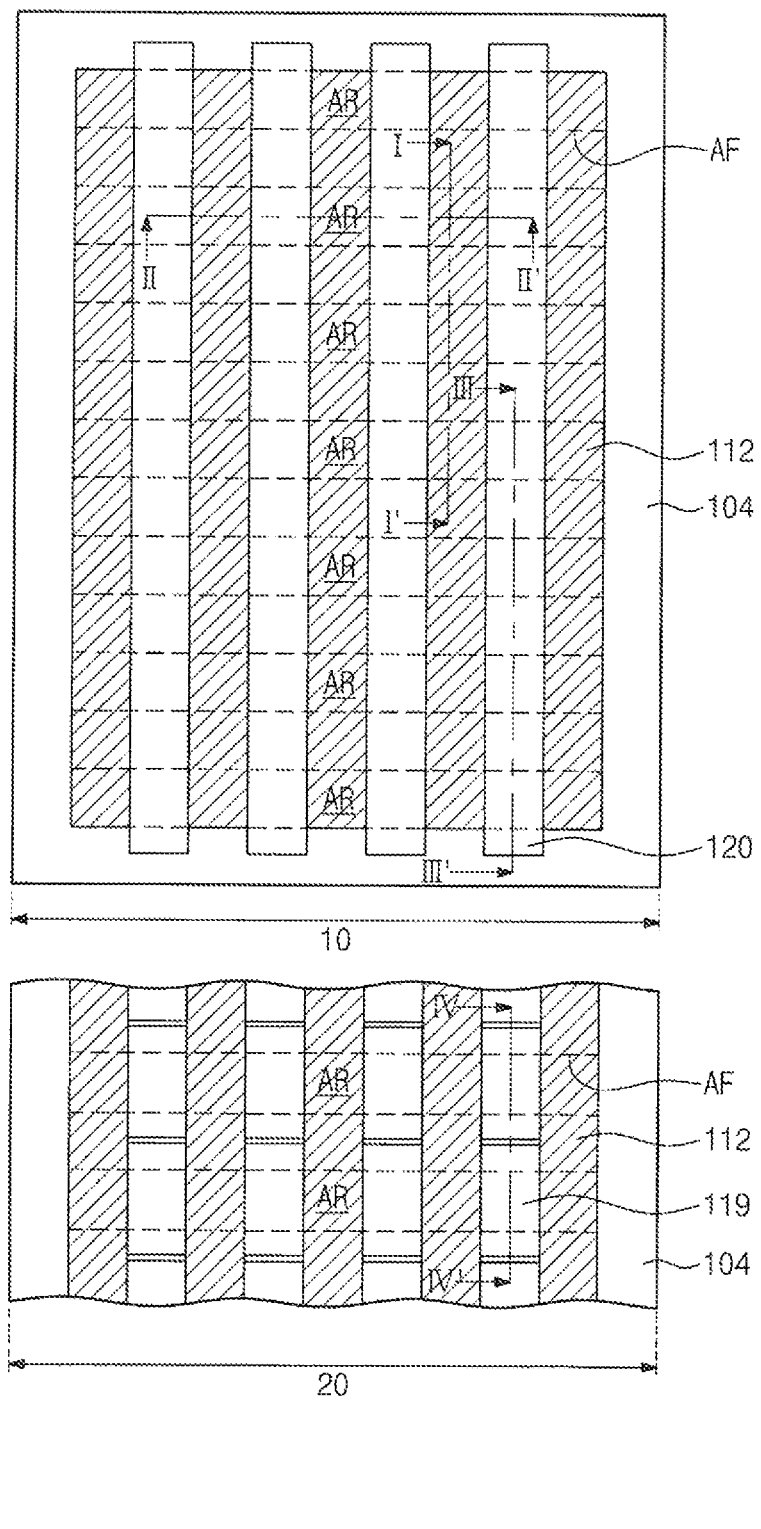
Figure 9B:
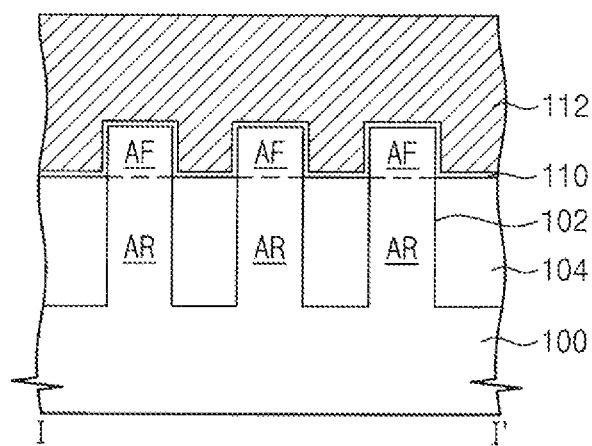
Figure 9C:
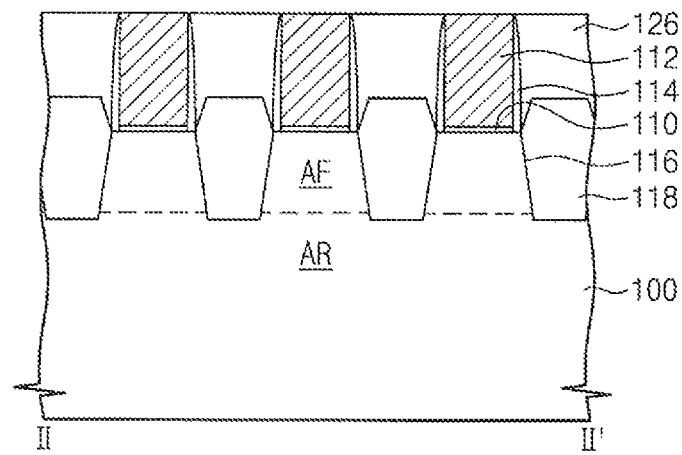
Figure 9D:
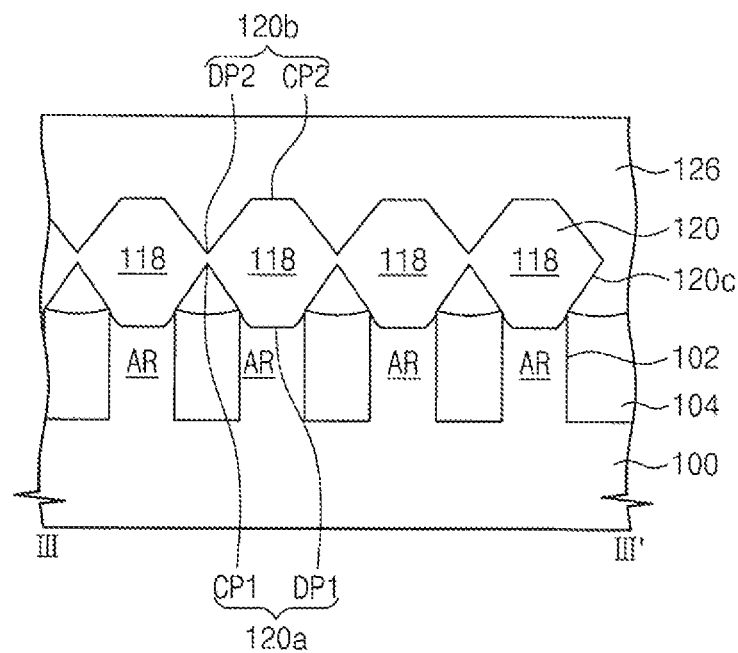
Figure 9E:
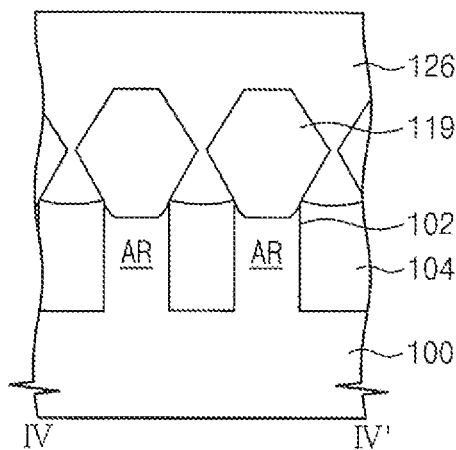
Figure 10A:
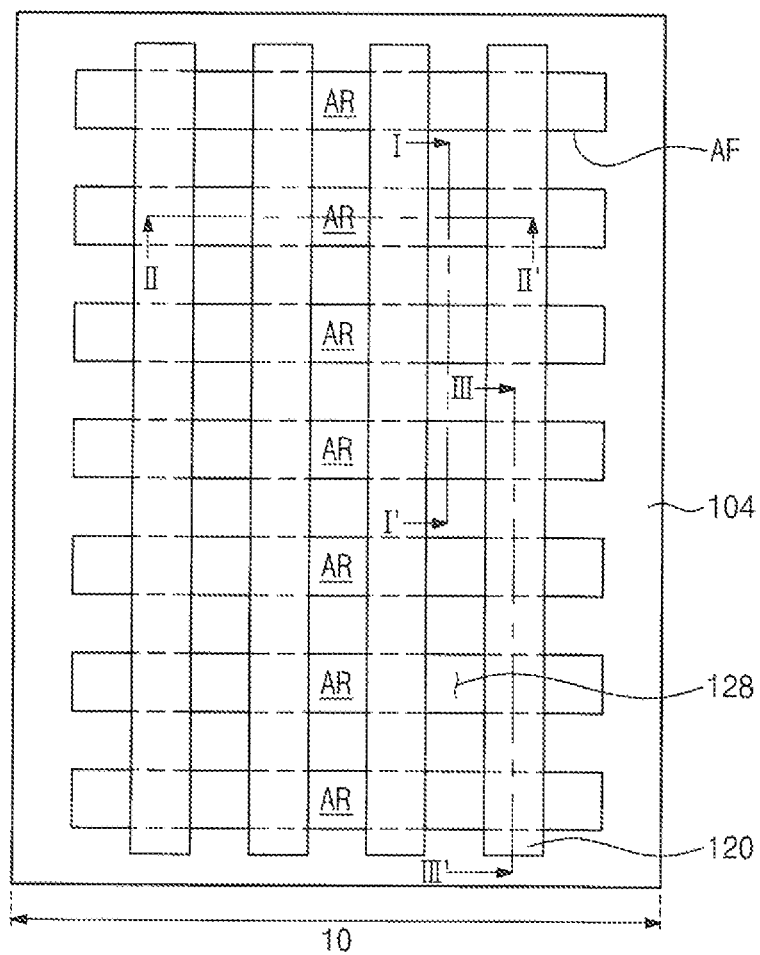
Figure 10A:
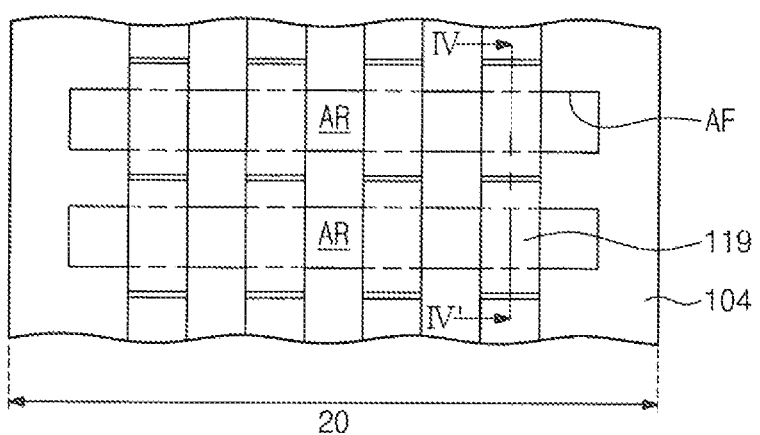
Figure 10B:
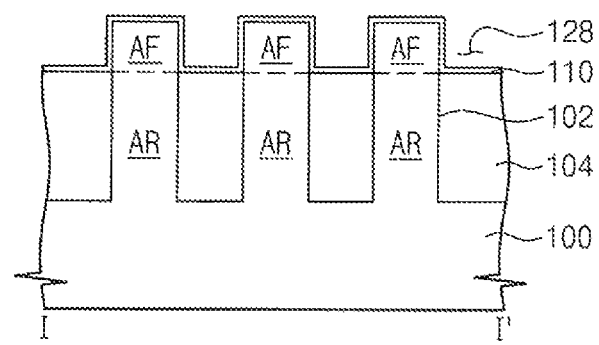
Figure 10C:
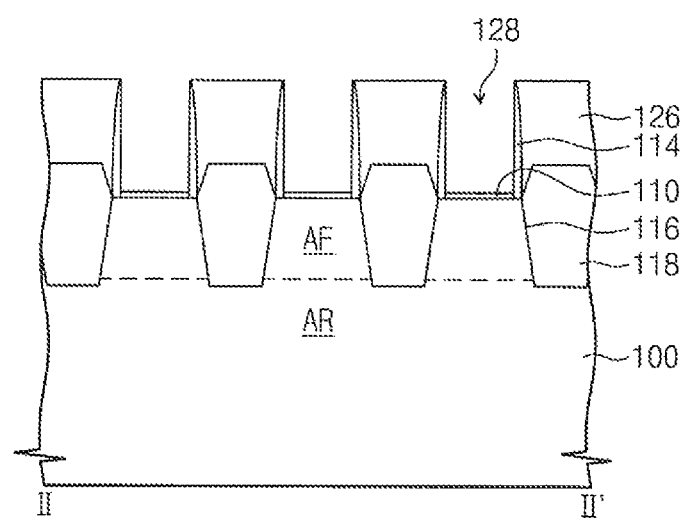
Figure 10D:
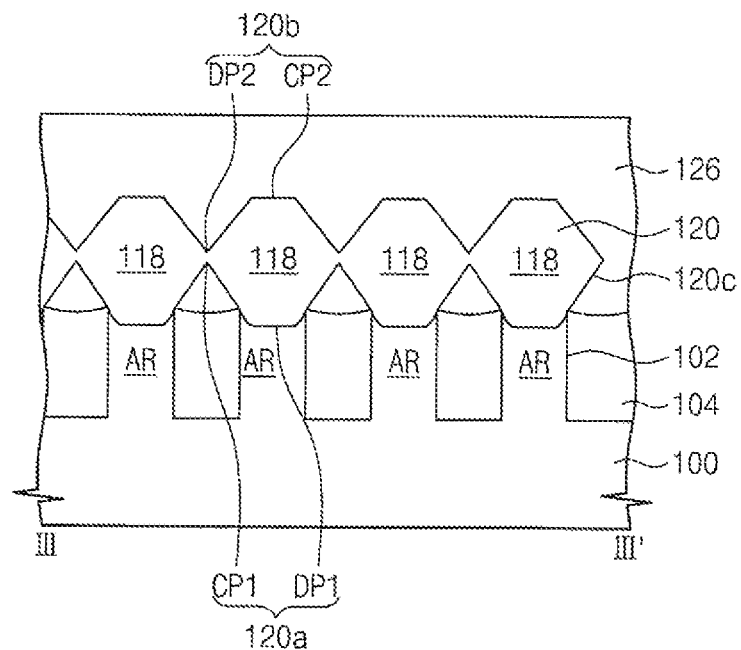
Figure 10E:
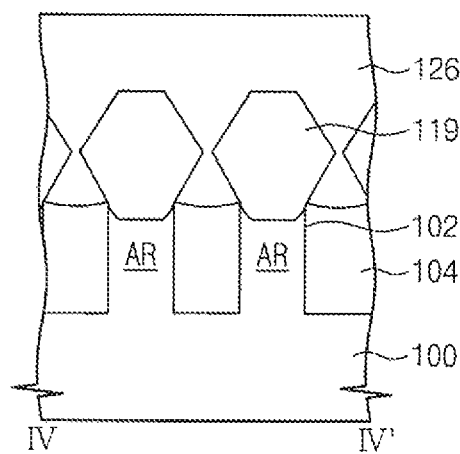
Figure 11A:
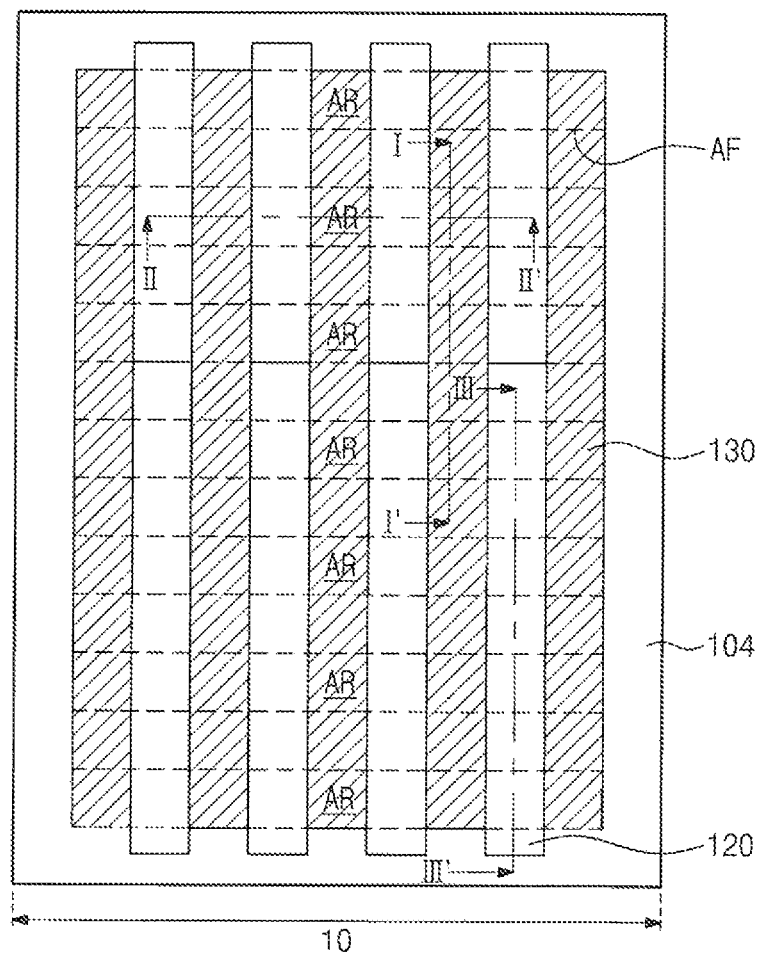
Figure 11A:
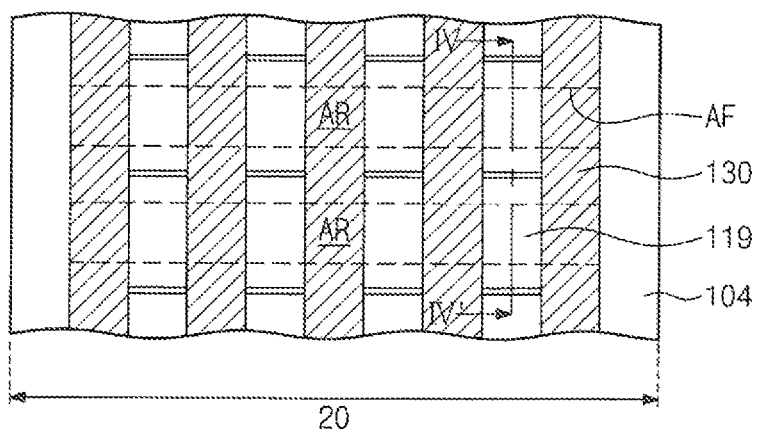
Figure 11A:
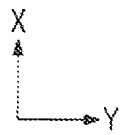
Figure 11B:
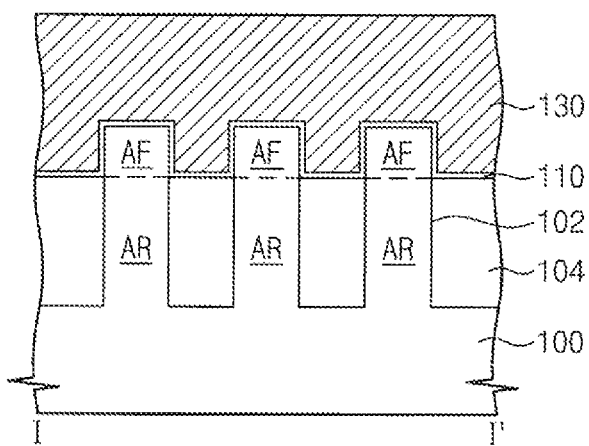
Figure 11C:
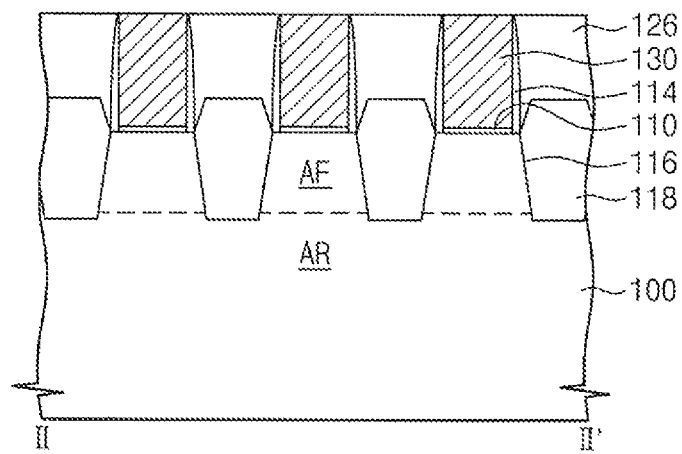
Figure 11D:
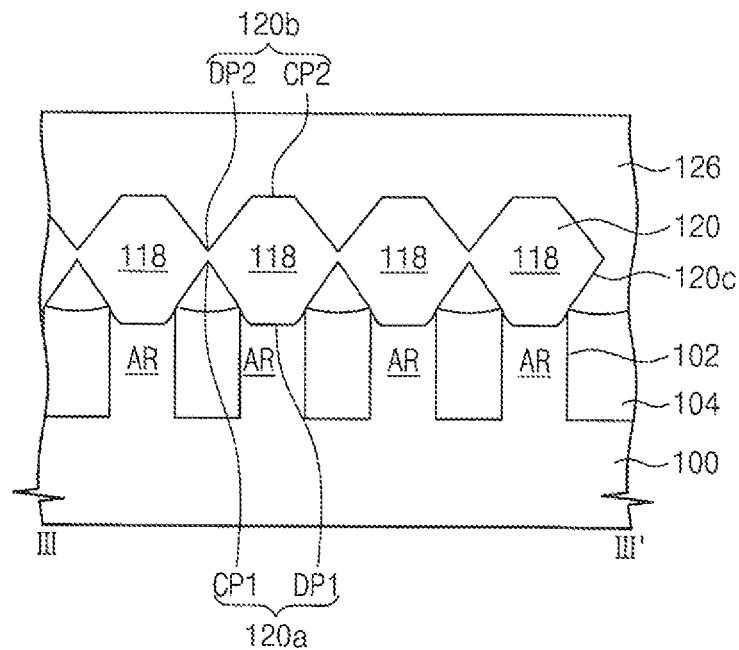
Figure 11E:
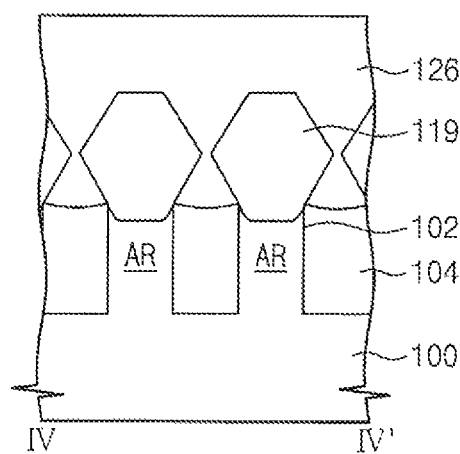
Figure 12A:
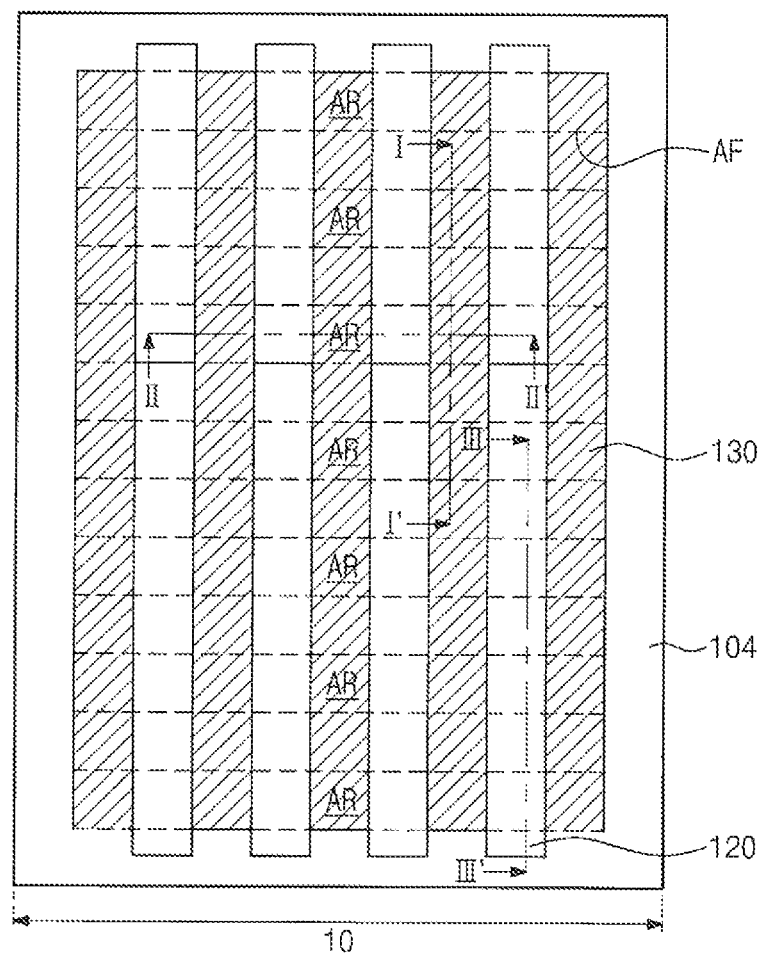
Figure 12A:
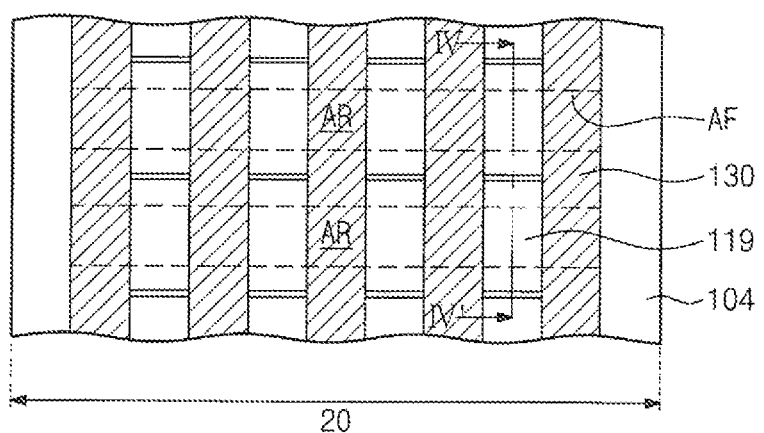
Figure 12B:
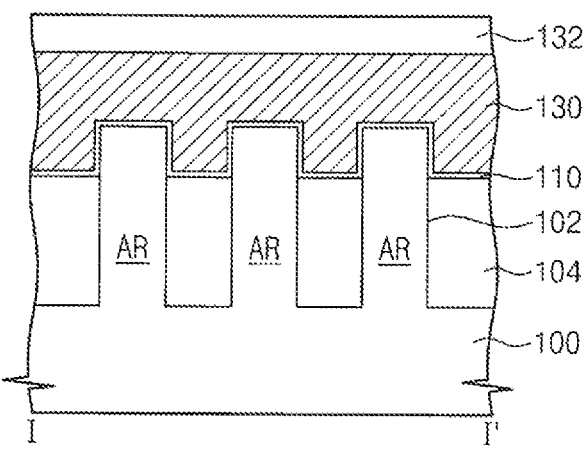
Figure 12C:
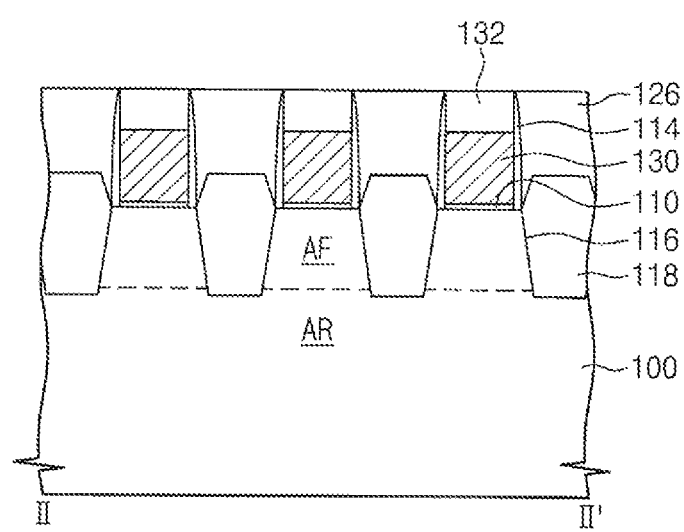
Figure 12D:
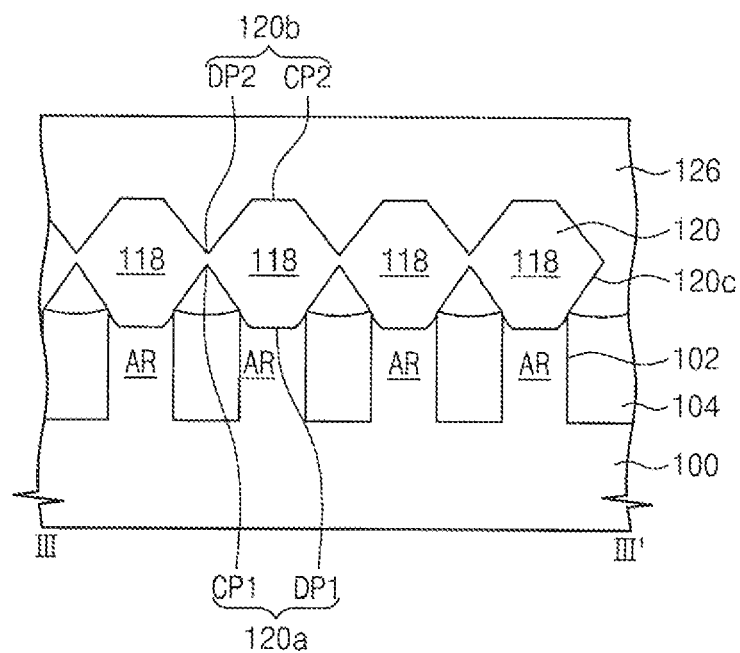
Figure 12E:
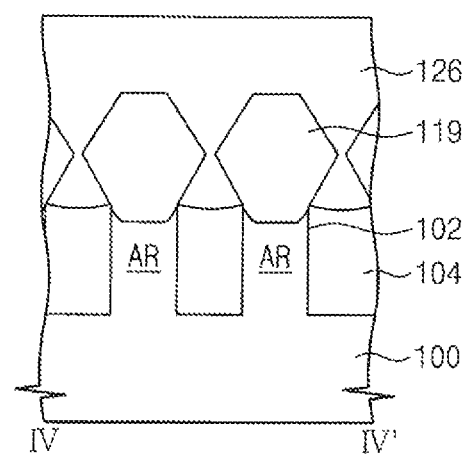

FIG. 1 is a perspective view illustrating a resistor according to example embodiments of the inventive concepts. FIG. 2 is a plan view illustrating semiconductor devices including a resistor according to example embodiments of the inventive concepts. FIGS. 3A, 3B, 3C, and 3D are cross-sectional views taken along lines I-I, II-II', III-III', and IV-IV' of FIG. 2, respectively.

Referring to FIGS. 1, 2, and 3A to 3D, a substrate 100 may include a first region 10 and a second region 20. A resistor 140 may be disposed in the first region 10, and a transistor may be disposed in the second region 20. A device isolation layer 104 may be disposed in the substrate 100 to define active regions AR. The active regions AR may include active fins AF, respectively. The active regions AR may be arranged in a first direction X. The active fins AF may correspond to upper portions of the active regions AR that protrude from a top surface of the device isolation layer 104. The active fins AF may be arranged in the first direction X.

First insulating patterns 110 may be disposed on the substrate 100. The first insulating patterns 110 may conformally cover surfaces of the active fins AF and the top surface of device isolation layer 104. Conductive patterns 130 may be disposed on the first insulating patterns 110, respectively. The conductive patterns 130 may cover the insulating patterns 110. The conductive patterns 130 may cross over the active fins AF and may be arranged in a second direction Y perpendicular to the first direction X. Each of the conductive patterns 130 may include one or more layers. The conductive patterns 130 formed on the substrate 100 of the second region 20 may correspond to gate electrodes of transistors. The conductive patterns 130 may include at least one of a work-function material (e.g., titanium nitride (TiN), tantalum nitride (TaN), aluminum nitride (AlN), tungsten nitride (WN), and/or molybdenum nitride (MoN)), a high-k dielectric material (e.g., hafnium oxide ($HfO_2$), hafnium-silicon oxide (HfSiO), hafnium-silicon oxynitride (HfSiON), hafnium oxynitride (HfON), hafnium-aluminum oxide (HfAlO), hafnium-lanthanum oxide (HfLaO), and/or tantalum oxide ($TaO_2$)), a metal material (e.g., tungsten (W), aluminum (Al), and/or or copper (Cu)), a silicide material, and/or a semiconductor material (e.g., silicon (Si)).

Second insulating patterns 132 may be disposed on the conductive patterns 130, respectively. The second insulating patterns 132 may cover top surfaces of the conductive patterns 130. For example, the second insulating patterns 132 may include at least one of silicon oxide, silicon, nitride, and/or silicon oxynitride. Spacers 114 may be disposed on sidewalls of the conductive patterns 130. The spacers 114 may cover the sidewalls of the conductive patterns 130 and sidewalls of the second insulating patterns 132.

FIG. 1 illustrates a portion of a resistance layer 120. Resistance patterns 118 may be disposed on the substrate 100 in the first region 10. The resistance layer 120 may be disposed between the conductive patterns 130 adjacent to each other. A plurality of the resistance layers 120 may be arranged in the second direction Y and may intersect the active regions AR. Each of the resistance layers 120 may include the resistance patterns 118. In more detail, portions of the active fins AF exposed by the conductive patterns 130 may be etched to form trenches 116. The resistance patterns 118 may be grown from the active regions AF exposed by the trenches 116 by an epitaxial growth method using the active regions AR exposed by the trenches 116 as a seed. The resistance patterns 118 arranged in the first direction X may be in contact with each other to constitute the resistance layer 120. Thus, the resistance layer 120 may correspond to an epitaxial layer grown from the substrate 100 (i.e., the active regions AR).

The resistance layer 120 may protrude from top surfaces of the active regions AR. A bottom surface 120a of the resistance layer 120 may include first convex portions CP1 and first depressed portions DP1 of which each is disposed between the first convex portions CP1 adjacent to each other. In other words, the bottom surface 120a of the resistance layer 120 may include the first convex portions CP1 and the first depressed portions DP1 which are alternately and repeatedly arranged in the first direction X. The first convex portion CP1 may be spaced apart from the device isolation layer 104. The first depressed portion DP1 may be in contact with the top surface of the substrate 100 (i.e., the top surface of the active region AR). A top surface 120b of the resistance layer 120 may include second convex portions CP2 and second depressed portions DP2 of which each is disposed between the second convex portions CP2 adjacent to each other. In other words, the top surface 120b of the resistance layer 120 may include the second convex portions CP2 and the second depressed portions DP2 which are alternately and repeatedly arranged in the first direction X. The first convex portion CP1 may face the second depressed portion DP2, and the first depressed portion DP1 may face the second convex portion CP2. A gap between facing portions of the first convex portion CP1 and the second depressed portion DP2 may contain portions of the resistance layer 120 and may delineate between individual ones of the resistance patterns 118.

A sidewall 120c of the resistance layer 120 may connect the bottom surface 120a and the top surface 120b of the resistance layer 120 to each other. The sidewall 120c of the resistance layer 120 may include a corner having a predetermined angle. The corners opposite to each other may protrude symmetrically. Thus, the sidewalls 120c of the resistance layer 120 which are opposite to each other may be symmetrical. In some embodiments of the inventive concepts, the sidewalls 120c of the resistance layer 120 which are opposite to each other may be asymmetrical.

A length of the resistance layer 120 in the first direction X may be longer than lengths of the conductive patterns 130 in the first direction X. Thus, both ends of the resistance layer 120 facing each other in the first direction X may be exposed from the conductive patterns 130. Both ends of the resistance layer 120 may be disposed on the device isolation layer 104.

Source/drain regions 119 may be formed on the substrate 100 (i.e., the active regions AR) in the second region 20. The source/drain regions 119 may be formed simultaneously with the resistance patterns 118. The source/drain regions 119 may be formed by the epitaxial growth method using the substrate 100 (i.e., the active region AR) as the seed. The source/drain regions 119 arranged in the first direction X may be spaced apart from each other.

A first interlayer insulating layer 126 may be disposed on the substrate 100. The first interlayer insulating layer 126 may cover the device isolation layer 104 and the resistance layer 120. A top surface of the first interlayer insulating layer 126 may be disposed at the same level as a top surface of the second insulating pattern 132. A second interlayer insulating layer 134 may be disposed on the first interlayer insulating layer 126. The second interlayer insulating layer 134 may cover the second insulating patterns 132 and the first interlayer insulating layer 126.

Contact electrodes 136 may penetrate the second and first interlayer insulating layers 134 and 126. Two contact electrodes 136 may be in contact with each of the resistance layers 120 disposed on the substrate 100 of the first region 10. The two contact electrodes 136 may be disposed on both end portions, facing each other, of the resistance layer 120. One of the two contact electrodes 136 may be in contact with one of the resistance patterns 118 included in each of the resistance layers 120, and the other of the two contact electrodes 136 may be in contact with another of the resistance patterns 118 included in each of the resistance layers 120. The two contact electrodes 136 facing each other in the first direction X and the resistance layer 120 being in contact with the two contact electrodes 136 may constitute one resistor 140. A current may flow along the first direction X through the resistance layer 120, and the resistance layer 120 may have an electrical resistance. A plurality of resistors 140 may be arranged in the second direction Y. A contact electrode 136 may be in contact with a source/drain region 119 in the second region 20.

Interconnection patterns may be disposed on the second interlayer insulating layer 134. The interconnection pattern may be electrically connected to the contact electrode 136. In the first region 10, the interconnection pattern may electrically connect the contact electrodes 136 formed on resistance layers 120 to each other. In other words, the resistors 140 arranged in the second direction Y may be connected in parallel to each other by the interconnection pattern in the first region 10.

A resistance value of the resistor 140 may be varied depending on a length L and a width W of the resistor 140. The length L may correspond to the length, in the first direction X, of the resistance layer 120 intersecting the active regions AR. The length L may be determined depending on the number of the active regions AR arranged in the first direction X. This is because the resistance patterns 118 disposed in the second trench 116 formed by recessing the active fins AF are connected to each other in the first direction X to constitute the resistance layer 120. In other words, the length L of the resistor 140 may increase as the number of the active fins AF increases. The width W of the resistor 140 may correspond to a width of the resistance layer 120 in the second direction Y. In some embodiments, the width W of the resistor 140 may be defined as a distance between the conductive patterns 130 adjacent to each other. The distance between the conductive patterns 130 may be determined depending on the number of the conductive patterns 130. This is because the distance between the conductive patterns 130 may be reduced as the number of the conductive patterns 130 increases. In other words, the width W of the resistor 140 may correspond to the distance between the conductive patterns 130 in the second direction Y.

FIGS. 4A to 12A are plan views illustrating a method of fabricating semiconductor devices including a resistor according to example embodiments of the inventive concepts. FIGS. 4B to 12B are cross-sectional views taken along lines I-I' of FIGS. 4A to 12A, respectively. FIGS. 4C to 12C are cross-sectional views taken along lines II-II' of FIGS. 4A to 12A, respectively. FIGS. 4D to 12D are cross-sectional views taken along lines III-III' of FIGS. 4A to 12A, respectively. FIGS. 4E to 12E are cross-sectional views taken along lines IV-IV' of FIGS. 4A to 12A, respectively.

Referring to FIGS. 4A to 4E, a substrate 100 may include a first region 10 and a second region 20. A device isolation layer 104 may be formed in the substrate 100 to define active regions AR. A first trench 102 may be formed in the substrate 100, and an insulating material may be formed to fill the first trench 102. The insulating material be planarized until a top surface of the substrate 100 is exposed, thereby forming the device isolation layer 104.

Upper portions of the active regions AR may be exposed to define active fins AF. In more detail, a top surface of the device isolation layer 104 may be recessed by an etching process to expose the upper portions of the active regions AR. The exposed upper portions of the AR may correspond to the active fins AF that protrude from the device isolation layer 104. The active fins AF may be arranged in a first direction X.

Referring to FIGS. 5A to 5E, an insulating layer 106 and a sacrificial layer 108 may be sequentially formed on the substrate 100. In detail, the insulating layer 106 may be conformally formed on the top surface of the substrate 100 and the active fins AF. The insulating layer 106 may include at least one of an oxide layer and a high-k dielectric layer. For example, the insulating layer 106 may include a silicon oxide layer, a hafnium oxide layer, a hafnium silicate layer, a zirconium oxide layer, and/or a zirconium silicate layer.

The sacrificial layer 108 may include a layer having an etch selectivity with respect to the insulating layer 106. For example, the sacrificial layer 108 may include a poly-silicon layer.

Referring to FIGS. 6A to 6E, the sacrificial layer 108 and the insulating layer 106 may be patterned to form a first insulating pattern 110 and a sacrificial pattern 112 that are sequentially stacked on the substrate 100. A structure consisting of the first insulating pattern 110 and the sacrificial pattern 112 may be provided in plurality. The sacrificial patterns 112 may intersect the active fins AF and may be arranged in a second direction Y perpendicular to the first direction X.

Spacers 114 may be formed on sidewalls of the sacrificial patterns 112. In some embodiments, a spacer insulating layer (e.g., a silicon oxide layer) may be conformally formed on the top surface of the substrate 100, the first insulating patterns 110 and the sacrificial patterns 112. The spacer insulating layer may be etched by an etch-back process until the top surface of the substrate 100 is exposed, thereby forming the spacers 114.

Referring to FIGS. 7A to 7E, the substrate 100 exposed by the sacrificial patterns 112 and the spacers 114 may be etched to form second trenches 116. The exposed substrate 100 may be etched by an anisotropic wet etching process or an anisotropic dry etching process to form the second trenches 116. The substrate 100 exposed by the sacrificial patterns 112 and the spacers 114 may correspond to portions of the active fins AF. An upper portion of the device isolation layer 104 exposed by the sacrificial patterns 112 may also be etched when the exposed substrate 100 is etched.

Referring to FIGS. 8A to 8E, resistance patterns 118 may be formed in the second trenches 116 of the first region 10, and source/drain regions 119 may be formed in the second trenches 116 of the second region 20. The substrate 100 exposed by the second trenches 116 may be used as a seed for forming the resistance patterns 118 and the source/drain regions 119. In other words, the resistance patterns 118 and the source/drain regions 119 may be grown from the substrate 100 by an epitaxial growth method. The substrate 100 exposed by the second trench 116 may have crystal planes different from each other. For example, the substrate 100 exposed through an inner sidewall of the second trench 116 may have a (110) crystal plane, and the substrate 100 exposed through a bottom surface of the second trench 116 may have a (100) crystal plane. The resistance pattern 118 grown from the crystal planes different from each other may have a sidewall having different crystal planes from each other. The sidewall of the resistance pattern 118 may have a laterally protruding corner having a predetermined angle.

The resistance patterns 118 arranged in the first direction X in the first region 10 may be in contact with each other to constitute a resistance layer 120. The resistance layer 120 may be provided in plurality in the second region 10. The resistance layers 120 may intersect the active regions AR and may be arranged in the second direction Y perpendicular to the first direction X. The resistance layer 120 may protrude from the active regions AR. A bottom surface 120a of the resistance layer 120 may include first convex portions CP1 and first depressed portions DP1 of which each is disposed between the first convex portions CP1 adjacent to each other. In other words, the bottom surface 120a of the resistance layer 120 may include the first convex portions CP1 and the first depressed portions DP1 which are alternately and repeatedly arranged in the first direction X. The first convex portion CP1 may be spaced apart from the device isolation layer 104. The first depressed portion DP1 may be in contact with the top surface of the substrate 100 (i.e., the top surface of the active region AR). A top surface 120b of the resistance layer 120 may include second convex portions CP2 and second depressed portions DP2 of which each is disposed between the second convex portions CP2 adjacent to each other. In other words, the top surface 120b of the resistance layer 120 may include the second convex portions CP2 and the second depressed portions DP2 which are alternately and repeatedly arranged in the first direction X. The first convex portion CP1 may face the second depressed portion DP2, and the first depressed portion DP1 may face the second convex portion CP2. A gap between facing portions of the first convex portion CP1 and the second depressed portion DP2 may contain portions of the resistance layer 120 and may delineate between individual ones of the resistance patterns 118.

A sidewall 120c of the resistance layer 120 may connect the bottom surface 120a and the top surface 120b of the resistance layer 120 to each other. The sidewall 120c of the resistance layer 120 may include a corner having a predetermined angle. The corners opposite to each other may protrude symmetrically. Thus, the sidewalls 120c of the resistance layer 120 which are opposite to each other may be symmetrical. In some embodiments of the inventive concepts, the sidewalls 120c of the resistance layer 120 which are opposite to each other may be asymmetrical.

The source/drain regions 119 arranged in the first direction X may be spaced apart from each other in the second region 20.

Various semiconductor components (e.g., a transistor and a resistor) may be formed on the substrate at the same time. The resistor may be formed simultaneously with the fin field effect transistor by the process of forming the fin field effect transistor. A resistance layer of the resistor may be formed by the epitaxial growth method for forming source/drain regions. The resistor may include the epitaxial layer used as the resistance layer and electrodes in contact with both end portions of the epitaxial layer. In a conventional resistor, a resistance layer may be formed by performing an epitaxial growth process on a silicon substrate exposed by a trench formed between gate electrodes. Thus, a length of the conventional resistance layer may be determined depending on the distance between the gate electrodes. A source/drain region having a narrow width may not affect operation of a transistor, but a resistance layer may be longer. Thus, in the conventional art, a trench having a wide width may be formed between the gate electrodes to increase the distance between the gate electrodes. However, as the width of the trench increases, an epitaxial layer may not be sufficiently grown from the substrate exposed through a bottom surface of the trench to a predetermined height. Thus, a non-uniform resistance layer may be formed resulting in a resistor having a non-uniform resistance value according to the length of the conventional resistance layer. In addition, the conventional resistance layer may have a non-uniform height, so contact failure may be caused between the conventional resistance layer and the electrode connected thereto.

According to embodiments of the inventive concepts, the distance between the sacrificial patterns 112 used for forming the resistor 140 in the first region 10 may be equal to the distance between gate electrodes (i.e., the width of the source/drain region 119) of fin field effect transistors to be formed in the second region 20. The resistance patterns 118 may be formed in the second trenches 116 by the epitaxial growth method using the substrate 100 exposed by the second trenches 116 as the seed. Since widths of the second trenches 116 are narrow, the resistance patterns 118 formed in the second trenches 116 may be sufficiently grown from the substrate 100 used as the seed to a predetermined height. The resistance patterns 118 formed on the active regions AR and arranged in the first direction X may be connected to each other to constitute one resistance layer 120 in the first region 10. Since the resistance layer 120 consists of the resistance patterns 118 which are sufficiently grown and uniformly formed, it is possible to form the resistor 140 having a substantially constant resistance value according to the length of the resistance layer 120. In addition, the resistance patterns 118 may be grown from the substrate 100 exposed through the bottom surfaces and the inner sidewalls of the second trenches 116 so as to fill the second trenches 116, so the resistance patterns 118 may have convex shapes. This means that contact electrodes 136 to be formed in a subsequent process may be stably in contact with the resistance layer 120 consisting of the resistance patterns 118.

Referring to FIGS. 9A to 9E, a first interlayer insulating layer 126 may be formed on the substrate 100 having the resistance layer 120. The first interlayer insulating layer 126 may be formed to cover the device isolation layer 104 and the resistance layer 120. The first interlayer insulating layer 126 may fill spaces between the bottom surface 120a of the resistance layer 120 and the top surface of the device isolation layer 104. The first interlayer insulating layer 126 may be formed to expose top surfaces of the sacrificial patterns 112. For example, the first interlayer insulating layer 126 may include at least one of a silicon oxide layer, a silicon nitride layer, a silicon oxynitride layer, and/or a low-k dielectric layer.

Referring to FIGS. 10A to 10E, the sacrificial patterns 112 may be selectively removed to form gap regions 128. The gap regions 128 may expose the first insulating patterns 110 and the spacers 114. The sacrificial patterns 112 may be removed using an etch recipe having an etch selectivity with respect to the first insulating patterns 110 and the spacers 114.

Referring to FIGS. 11A to 11E, conductive patterns 130 may be formed in the gap regions 128, respectively. In some embodiments, a conductive layer may be formed on the first interlayer insulating layer 126 to fill the gap regions 128. The conductive layer may be planarized until a top surface of the first interlayer insulating layer 126 is exposed, thereby forming the conductive patterns 130. The conductive patterns 130 may include one or more layers. The conductive patterns 130 formed in the second region 20 may correspond to gate electrodes of transistors. The conductive patterns 130 may include a work-function material (e.g., titanium nitride (TiN), tantalum nitride (TaN), aluminum nitride (AlN), tungsten nitride (WN), and/or molybdenum nitride (MoN)), a high-k dielectric material (e.g., hafnium oxide ($HfO_2$), hafnium-silicon oxide (HfSiO), hafnium-silicon oxynitride (HfSiON), hafnium oxynitride (HfON), hafnium-aluminum oxide (HfAlO), hafnium-lanthanum oxide (HfLaO), and/or tantalum oxide ($TaO_2$)), a metal material (e.g., tungsten (W), aluminum (Al), and/or copper (Cu)), a silicide material, and/or a semiconductor material (e.g., silicon (Si)).

Referring to FIGS. 12A to 12E, top surfaces of the conductive patterns 130 may be recessed by etching upper portions of the conductive patterns 130. Thus, upper regions of the gap regions 128 may become empty. Second insulating patterns 132 may be formed to fill the empty upper regions of the gap regions 128, respectively. The second insulating patterns 132 may include, for example, silicon oxide, silicon nitride, and/or silicon oxynitride.

Referring again to FIGS. 2 and 3A to 3D, a second interlayer insulating layer 134 may be formed on the first interlayer insulating layer 126 and the conductive patterns 130.

Contact electrodes 136 may be formed to penetrate the second and first interlayer insulating layers 134 and 126. Through-holes exposing portions of the resistance layers 120 may be formed to penetrate the second and first interlayer insulating layers 134 and 126 in the first region 10. The through-holes of the first region 10 may be filled with a conductive material to form the contact electrodes 136 of the first region 10. One resistance layer 120 may be in contact with at least two contact electrodes 136. In more detail, one contact electrode 136 may be electrically connected to one end portion of the resistance layer 120, and another contact electrode 136 may be electrically connected to another end portion of the resistance layer 120. The contact electrodes 136 may include, for example, a metal material (e.g., tungsten or copper), a silicide material, and/or doped polysilicon. The contact electrodes 136 facing each other in the first direction X and the resistance layer 120 connected thereto may constitute one resistor 140. A current may flow along the first direction X through the resistance layer 120 of the resistor 140.

Through-holes exposing the source/drain regions 119 may be formed to penetrate the second and first interlayer insulating layers 134 and 126 in the second region 20. The through-holes of the second region 20 may be filled with a conductive material to form the contact electrodes 136 of the second region 20. A source/drain region 119 may be in contact with a contact electrode 136.

Interconnection patterns may be formed on the second interlayer insulating layer 134. The interconnection pattern formed in the first region 10 may be electrically connected to the contact electrodes 136 of the resistors 140 arranged in the second direction Y. The interconnection pattern formed in the second region 20 may be electrically connected to a source/drain region 119.

Figure 13:
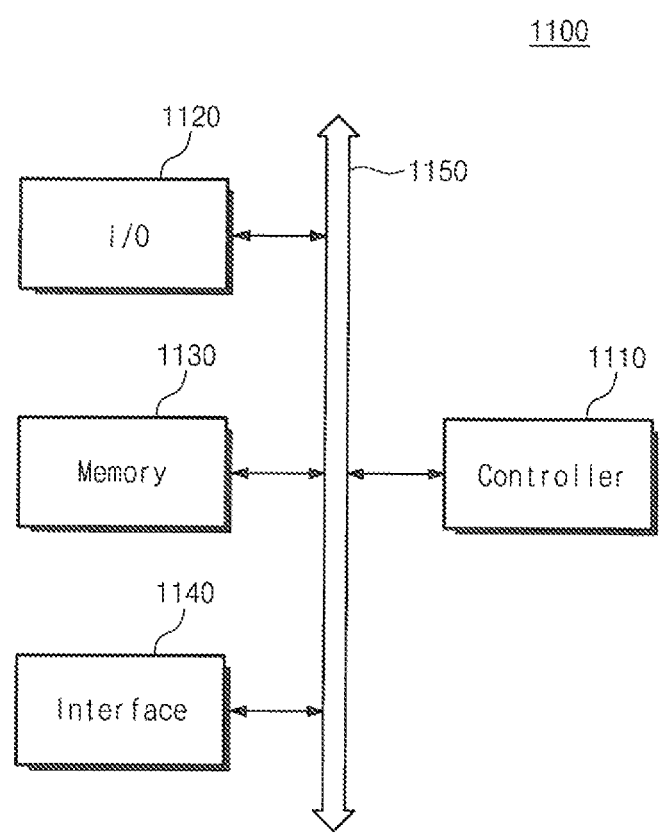
FIG. 13 is a schematic block diagram illustrating an electronic system including a resistor according to example embodiments of the inventive concepts.

FIG. 13 is a schematic block diagram illustrating an electronic system including a resistor according to example embodiments of the inventive concepts.

Referring to FIG. 13, an electronic system 1100 according to an example embodiment may include a controller 1110, an input/output (I/O) unit 1120, a memory device 1130, an interface unit 1140, and a data bus 1150. At least two of the controller 1110, the I/O unit 1120, the memory device 1130, and/or the interface unit 1140 may communicate with each other through the data bus 1150. The data bus 1150 may correspond to a path through which electrical signals are transmitted.

The controller 1110 may include at least one of a microprocessor, a digital signal processor, a microcontroller, and/or other logic device having a similar function to any one thereof. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. The electronic system 1100 may further include a fast dynamic random access memory (DRAM) device and/or a fast static random access memory (SRAM) device which acts as a cache memory for improving an operation of the controller 1110. The resistor according to embodiments of the inventive concepts may be provided in at least one of the memory device 1130, the controller 1110, the interface unit 1140, and/or the I/O unit 1120.

The electronic system 1100 may be applied to a personal digital assistant (PDA), a portable computer, a web tablet, a wireless phone, a mobile phone, a digital sic player, a memory card, or other electronic products receiving or transmitting information data by wireless.

The electronic system 1100 may be applied to electronic control devices of various electronic devices.

Figure 14:
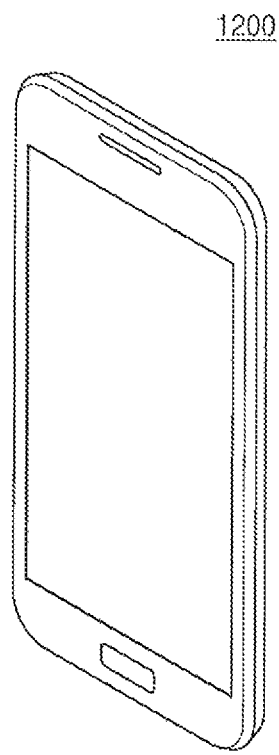
FIG. 14 illustrates a mobile phone implemented with an electronic system including a resistor according to example embodiments of the inventive concepts.

FIG. 14 illustrates a mobile phone 1200 implemented with the electronic system 1100 or FIG. 13. In other embodiments, the electronic system 1100 of FIG. 13 may be applied to a portable notebook computer, an MP3 player, a navigation device, a solid state disk (SSD), a car, or household appliances.

The resistor according to embodiments of the inventive concepts may include the resistance layer having resistance patterns that are arranged in a first direction and are connected to each other. In other words, the resistance layer may include resistance patterns which are sufficiently and uniformly formed. Thus, it may be possible to realize a resistor having a substantially constant resistance value according to the length of the resistance layer.

The resistance patterns may be formed to sufficiently fill the trench by an epitaxial growth method using the substrate exposed by the trench as the seed. Thus, the contact electrodes may be stably in contact with the resistance layer consisting of the resistance patterns.

While the inventive concepts have been described with reference to example embodiments, it will be apparent to those skilled in the art that various changes and modifications may be made without departing from the spirits and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A resistor comprising:
a substrate;
a device isolation layer in the substrate which defines active regions arranged in a first direction, the active regions respectively including active fins vertically protruding from a top surface of the device isolation layer,
wherein respective ones of the active fins comprise a plurality of recessed regions arranged in a second direction crossing the first direction;
an electrical resistance layer comprising electrical resistance patterns that vertically protrude from the active regions and are arranged in the first direction so as to be connected to each other, wherein respective ones of the electrical resistance patterns overlap respective ones of the recessed regions of the active fins and are not on an uppermost surface of the active fins; and
contact electrodes directly in contact with the electrical resistance layer.

2. The resistor of claim 1, wherein a bottom surface of the electrical resistance layer comprises first convex portions and first depressed portions that are alternately and repeatedly arranged.

3. The resistor of claim 2, wherein a top surface of the electrical resistance layer comprises second convex portions and second depressed portions that are alternately and repeatedly arranged,
wherein the first convex portions face the second depressed portions, respectively, and
wherein the first depressed portions face the second convex portions, respectively.

4. The resistor of claim 2, wherein the first convex portions are on the device isolation layer, and
wherein respective ones of the first depressed portions are on respective ones of the active regions.

5. The resistor of claim 4, wherein the first convex portions are spaced apart from the device isolation layer, and
wherein respective ones of the first depressed portions are in contact with respective ones of the active regions.

6. The resistor of claim 1, wherein the electrical resistance layer comprises an epitaxial layer grown from the active regions by an epitaxial growth method.

7. The resistor of claim 1, wherein the contact electrodes are configured to conduct an electrical current in the first direction through the electrical resistance layer.

8. A semiconductor device comprising:
a substrate comprising a first region and a second region;
a device isolation layer in the substrate which defines active regions, the active regions respectively including active fins vertically protruding from a top surface of the device isolation layer, wherein the active fins are arranged in a first direction, and wherein respective ones of the active fins comprise a plurality of recessed regions arranged in a second direction crossing the first direction;
conductive patterns intersecting the active fins;
an electrical resistance layer comprising electrical resistance patterns that protrude from the active regions between the conductive patterns in the first region and are arranged in the first direction so as to be connected to each other, the electrical resistance layer intersecting the active regions; and
contact electrodes if electrically coupled to the electrical resistance layer.

9. The semiconductor device of claim 8, wherein a length of the electrical resistance layer in the first direction is longer than a length of the conductive patterns in the first direction such that a first end of the electrical resistance layer and a second end of the electrical resistance layer, opposite to each other in the first direction, extend beyond the conductive patterns.

10. The semiconductor device of claim 9, wherein the first end of the electrical resistance layer and the second end of the electrical resistance layer are on the device isolation layer.

11. The semiconductor device of claim 8, further comprising:
source/drain regions protruding from the active regions between the conductive patterns in the second region,
wherein the source/drain regions are spaced apart from each other in the first direction and separated from each other in the second direction by the conductive patterns, and
wherein the source/drain regions include substantially the same material as the electrical resistance layer.

12. The semiconductor device of claim 8, wherein a distance between the conductive patterns defines a width of the electrical resistance layer, and
wherein the width of the electrical resistance layer is reduced as a number of the conductive patterns increases.

13. The semiconductor device of claim 8, wherein a bottom surface of the electrical resistance layer comprises first convex portions and first depressed portions that are alternately and repeatedly arranged.

14. The semiconductor device of claim 8, wherein the contact electrodes comprise a first contact electrode electrically coupled to a first end of the electrical resistance layer and a second contact electrode electrically coupled to a second end of the electrical resistance layer which are opposite to each other in the first direction
wherein the first contact electrode is in contact with a first resistance pattern and the second contact electrode is in contact with a second resistance pattern.

15. The semiconductor device of claim 8, wherein respective ones of the electrical resistance patterns overlap recessed regions of the active fins and do not overlap an uppermost surface of the active fins.

16. A semiconductor device comprising:
a substrate;
a device isolation layer in the substrate which defines a plurality of active regions arranged in a first direction and extending in a second direction crossing the first direction;
a plurality of active fins on respective ones of the plurality of active regions, the plurality of active fins arranged in the first direction and extending in the second direction, wherein respective ones of the active fins comprise plurality of recessed portions arranged in the second direction; and
a plurality of electrical resistance layers on the plurality of the active regions, the plurality of electrical resistance layers arranged in the second direction and extending in the first direction and further comprising:
 a plurality of electrical resistance patterns connected to one another and disposed on respective ones of the plurality of active regions,
 wherein respective ones of the plurality of electrical resistance patterns are in the recessed portions of respective ones of the plurality of active fins and are not on an uppermost surface of the respective ones of the plurality of active fins.

17. The semiconductor device of claim 16,
wherein a bottom surface of respective ones of the plurality of electrical resistance layers comprises first convex portions and first depressed portions that are alternately and repeatedly arranged,
wherein a top surface of respective ones of the plurality of electrical resistance layers comprises second convex portions and second depressed portions that are alternately and repeatedly arranged,
wherein respective ones of the first convex portions face respective ones of the second depressed portions, and
wherein respective ones of the first depressed portions face respective ones of the second convex portions.

18. The semiconductor device of claim 16, further comprising a plurality of conductive patterns on the plurality of the active regions, the plurality of conductive patterns arranged in the second direction and extending in the first direction,
wherein respective ones of the plurality of electrical resistance layers are between respective ones of the conductive patterns,
wherein respective ones of the plurality of conductive patterns are on the uppermost surface of respective ones of the active fins and are not on the plurality of electrical resistance patterns, and
wherein a width of a respective one of the plurality of electrical resistance layers corresponds to a distance between adjacent first and second conductive patterns.

19. The semiconductor device of claim 16, wherein a respective one of the electrical resistance patterns has a sidewall comprising at least two crystal planes.

20. The semiconductor device of claim 16, further comprising a plurality of contract electrodes electrically coupled to respective ones of the plurality of electrical resistance layers and configured to conduct an electrical current in the first direction through the respective ones of the plurality of electrical resistance layers.

* * * * *